United States Patent
Liu et al.

(10) Patent No.: US 12,122,665 B2
(45) Date of Patent: Oct. 22, 2024

(54) MICRO-ELECTROMECHANICAL SYSTEM DEVICE USING A METALLIC MOVABLE PART AND METHODS FOR FORMING THE SAME

(71) Applicant: Taiwan Semiconductor Manufacturing Company Limited, Hsinchu (TW)

(72) Inventors: Tao-Cheng Liu, Hsinchu (TW); Chen-Hsuan Yen, Taichung (TW); Ying-Hsun Chen, Taoyuan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 242 days.

(21) Appl. No.: 17/459,253

(22) Filed: Aug. 27, 2021

(65) Prior Publication Data

US 2023/0066841 A1 Mar. 2, 2023

(51) Int. Cl.
*B81B 3/00* (2006.01)
*B81C 1/00* (2006.01)
*G01P 1/00* (2006.01)
*G01P 15/08* (2006.01)

(52) U.S. Cl.
CPC .......... *B81B 3/007* (2013.01); *B81C 1/00658* (2013.01); *G01P 1/00* (2013.01); *G01P 15/08* (2013.01); *B81B 2201/0235* (2013.01); *B81B 2203/0136* (2013.01); *B81B 2203/04* (2013.01);
(Continued)

(58) Field of Classification Search
CPC ............ B81B 3/007; B81B 2201/0235; B81B 2203/0136; B81B 2203/04; B81B 2201/033; B81B 2203/0163; B81B 7/0009; B81B 7/02; B81C 1/00658; B81C 2201/0133; B81C 2201/0181;
(Continued)

(56) References Cited

U.S. PATENT DOCUMENTS

| | | | | |
|---|---|---|---|---|
| 6,133,670 A | * | 10/2000 | Rodgers | H02N 1/008 310/40 MM |
| 6,149,190 A | * | 11/2000 | Galvin | G01P 15/0802 73/514.32 |
| 2022/0267145 A1 | * | 8/2022 | Chen | B81C 1/00063 |

FOREIGN PATENT DOCUMENTS

| CN | 101792110 A | 8/2010 |
|---|---|---|
| CN | 102955046 A | 3/2013 |

OTHER PUBLICATIONS

TW Patent and Trademark Office; TW Application No. 111100855; first Office Action mailed Apr. 18, 2023; 8 pages.
(Continued)

*Primary Examiner* — Shahed Ahmed
*Assistant Examiner* — Sun Mi Kim King
(74) *Attorney, Agent, or Firm* — The Marbury Law Group, PLLC

(57) ABSTRACT

A micro-electromechanical system (MEMS) device includes a movable comb structure located in a cavity within an enclosure, and a stationary structure affixed to the enclosure. The movable comb structure includes a comb shaft portion and movable comb fingers laterally protruding from the comb shaft portion. The movable comb structure includes a metallic material portion. The movable structure and the stationary structure are configured to generate an electrical output signal based on lateral movement of the movable structure relative to the stationary structure.

20 Claims, 27 Drawing Sheets

(52) U.S. Cl.
CPC ............... *B81C 2201/0133* (2013.01); *B81C 2201/0181* (2013.01)

(58) Field of Classification Search
CPC ... B81C 1/00619; B81C 1/00015; G01P 1/00; G01P 15/08; G01P 15/18; G01P 15/125
See application file for complete search history.

(56) References Cited

OTHER PUBLICATIONS

TW Patent and Trademark Office; TW Application No. 111100855; third Office Action mailed May 24, 2024; 14 pages.

\* cited by examiner

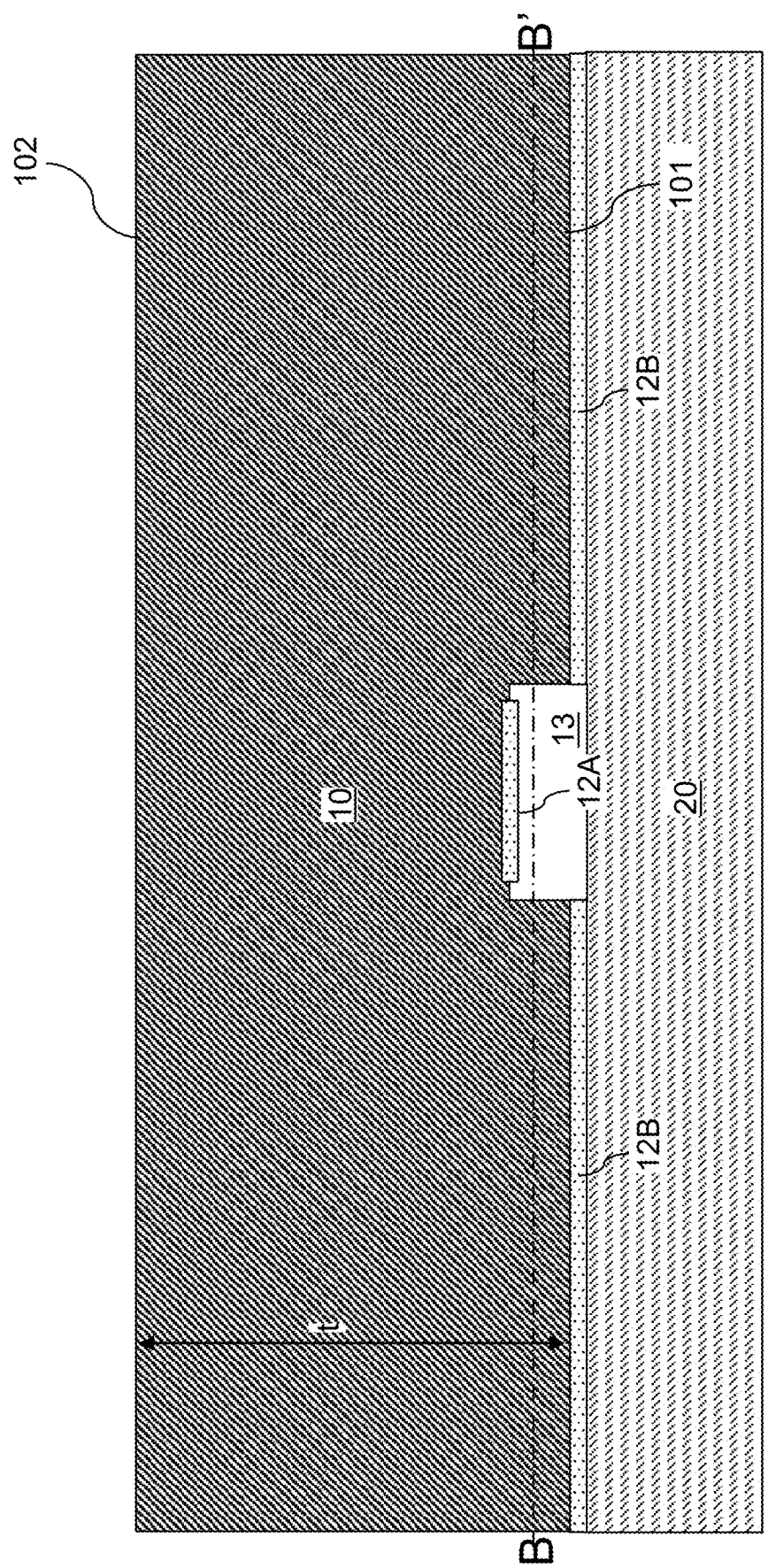

MICRO-ELECTROMECHANICAL SYSTEM DEVICE USING A METALLIC MOVABLE PART AND METHODS FOR FORMING THE SAME

BACKGROUND

Micro-electro mechanical system (MEMS) devices include devices that may be fabricated using semiconductor technology to form mechanical and electrical features. MEMS devices may include moving parts having dimensions of microns or sub-microns and a mechanism for electrically coupling the moving parts to an electrical signal. The electrical signal may be an input signal that induces movement on to the moving parts or an output signal that is generated by the movement of the moving parts. MEMS devices are useful devices that may be integrated with other devices, such as semiconductor devices, to function as sensors or as actuators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a vertical cross-sectional view of the exemplary structure after bonding the semiconductor matrix material layer to a cap substrate according to an embodiment of the present disclosure.

DETAILED DESCRIPTION

Figure 1A:
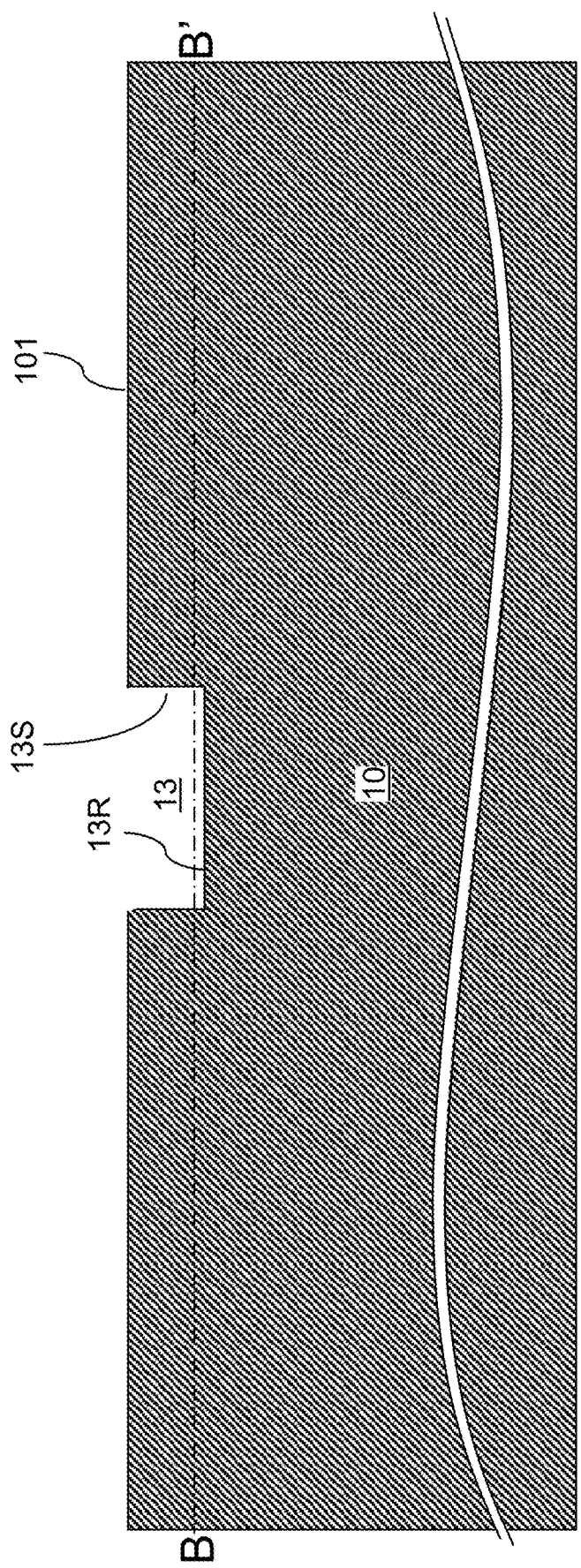
FIG. 1A is a vertical cross-sectional view of an exemplary structure including a semiconductor matrix material layer after formation of a recess cavity according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A MEMS device may have numerous useful applications. For example, a CMOS image sensor may include a motion stabilizer. The motion stabilizer may detect motion that the image sensor undergoes and compensate for that motion in the generation of the detected image. The MEMS device may detect vibrations as a change in capacitance as structures within the MEMS device move toward and away from stationary structures thereby varying the capacitance between the structures. Since structures within the MEMS device are intended to move, such structures may be prone to break when the motion is excessive, such as when the device is dropped. Therefore, improved strength to the moving structures within the MEMS device may be desired.

Generally, embodiments of the present disclosure are directed to a microstructure including a micro-electromechanical system (MEMS) device. The MEMS device contains a precise proof mass for measuring movement of an object to which the MEMS device is attached. For example, the MEMS device may include an accelerometer. Embodiments of the present disclosure may be used to form a high precision proof mass for the MEMS device.

Specifically, trenches may be formed on one side of the semiconductor matrix material layer. The trenches may include, for example, a first trench and a second trench. In one embodiment, the trenches may include comb trenches that have a respective comb-shaped horizontal cross-sectional shape. Such trenches are herein referred to as comb trenches. The comb trenches may include two interdigitated pairs of a respective inner comb trench and a respective outer comb trench. A first portion of the semiconductor matrix material layer to be subsequently patterned into a proof mass, i.e., a center mass portion, may be located between the two inner comb trenches. The outer comb trenches may be connected by comb shaft extension trenches. The outer comb trenches and the comb shaft extension trenches collectively enclose all inner comb trenches, and define a lateral boundary for a cavity to be subsequently formed. The common comb shaft cavity portion may define a boundary of a cavity in which a movable element to be subsequently formed is laterally confined.

A dielectric liner layer and at least one conductive fill material may be deposited in the comb trenches, and excess portions of the dielectric liner layer and the at least one conductive fill material located above the horizontal plane including the top surface of the semiconductor matrix material layer may be removed by a planarization process. According to some embodiments, a plurality of conductive fill materials may be employed to provide enhanced fill profile and to increase mechanical and electrical properties of electrodes to be formed. Remaining portions of the dielectric liner layer and the at least one conductive fill material in each comb trench comprise comb structures. The comb structures include movable comb structures formed in the inner comb trenches and stationary comb structures formed in the outer comb trenches. A movable structure including the center mass portion, the movable comb structure, and the stationary comb structure may be detached from the second semiconductor oxide plate. The interdigitated comb structures comprise a capacitor structure that generates a change in the capacitance when the movable structure moves relative to a stationary structure including the stationary comb structures. The microstructure may include an accelerometer that may detect acceleration of a system to which the microstructure is attached. Use of multiple materials for filling the comb trenches can provide structural and electrical benefits to the microstructure. The various aspects of embodiments of the present disclosure are described in further detail below.

Figure 1B:
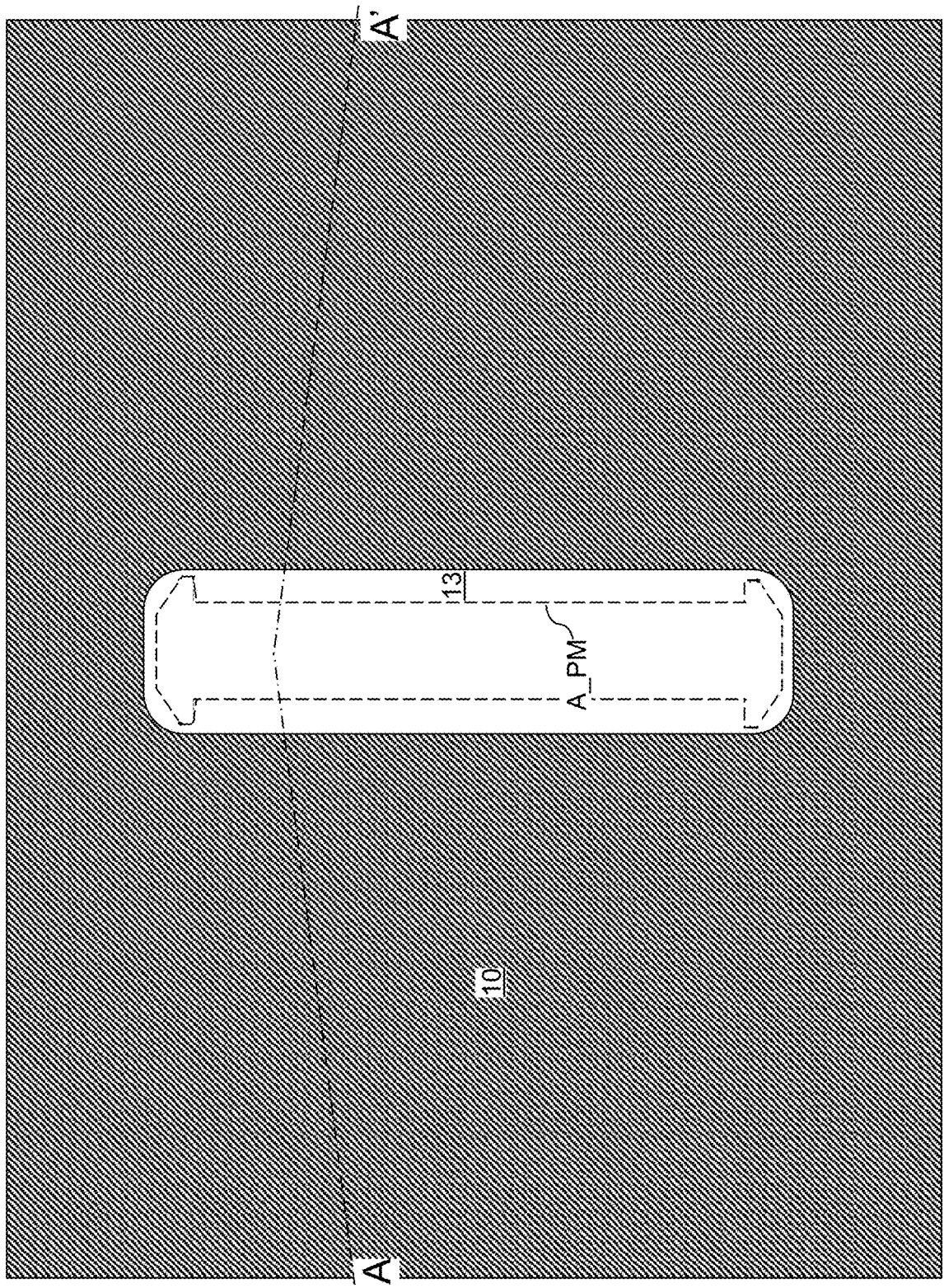
FIG. 1B is a horizontal cross-sectional view of the exemplary structure along the horizontal plane B-B' of FIG. 1A.

Referring to FIGS. 1A and 1B, a semiconductor matrix material layer 10 is illustrated, which may be provided as a planar structure including a first horizontal surface 101 on a first side and a backside surface (i.e., second horizontal surface) on a second side with a uniform thickness throughout, but not necessarily limited thereby. The semiconductor matrix material layer 10 includes a first semiconductor material, which may be a single crystalline semiconductor material or a polycrystalline semiconductor material. In one embodiment, the semiconductor matrix material layer 10 may include a single crystalline semiconductor layer such as a single crystalline silicon layer. The uniform thickness of the semiconductor matrix material layer 10 may be in a range from 30 microns to 1 mm, such as from 100 microns to 600 microns. While a region for forming a single accelerometer is illustrated in FIGS. 1A and 1B, it is understood that a two-dimensional array of accelerometers may be formed on a single wafer. Thus, the pattern illustrated in FIGS. 1A and 1B may be repeated in pattern of a two-dimensional array over the semiconductor matrix material layer 10.

A photoresist layer (not shown) may be applied over the first horizontal surface 101 of the semiconductor matrix material layer 10. The photoresist layer may be lithographically patterned to form an opening having a general shape of a proof mass (which is also referred to as a center mass portion) to be subsequently formed. In one embodiment, the periphery of the opening in the photoresist layer may be laterally offset outward from a periphery of the proof mass to be subsequently formed by a lateral offset distance. The lateral offset distance may be, for example, in a range from 0.5 micron to 30 microns. Thus, the area of the opening in the photoresist layer may have a greater area than the area (A_PM) of the proof mass to be subsequently formed. In a non-limiting illustrative example, the opening in the photoresist layer may have an elongated rounded rectangular shape with a lengthwise dimension in a range from 300 microns to 6 mm, and a widthwise dimension in a range from 30 microns to 600 microns, although lesser and greater dimensions may also be used.

The pattern of the opening in the photoresist layer may be transferred into an upper portion of the semiconductor matrix material layer 10 by an etch process, which may include an anisotropic etch process or an isotropic etch process. A recess cavity 13 that is vertically recessed from the first horizontal surface 101 of the semiconductor matrix material layer 10 may be formed. A recessed horizontal surface may be provided at the bottom of the recess cavity 13. The recess depth of the recess cavity 13 may be in a range from 0.3 micron to 10 microns, such as from 0.6 microns to 5 microns, although lesser and greater recess depths may also be used. The recess cavity 13 has sidewalls 13S that connect a recessed bottom surface 13R of the recess cavity 13 to the un-recessed portions of the first horizontal surface 101 of the semiconductor matrix material layer 10. The photoresist layer may be subsequently removed, for example, by ashing.

Figure 2:
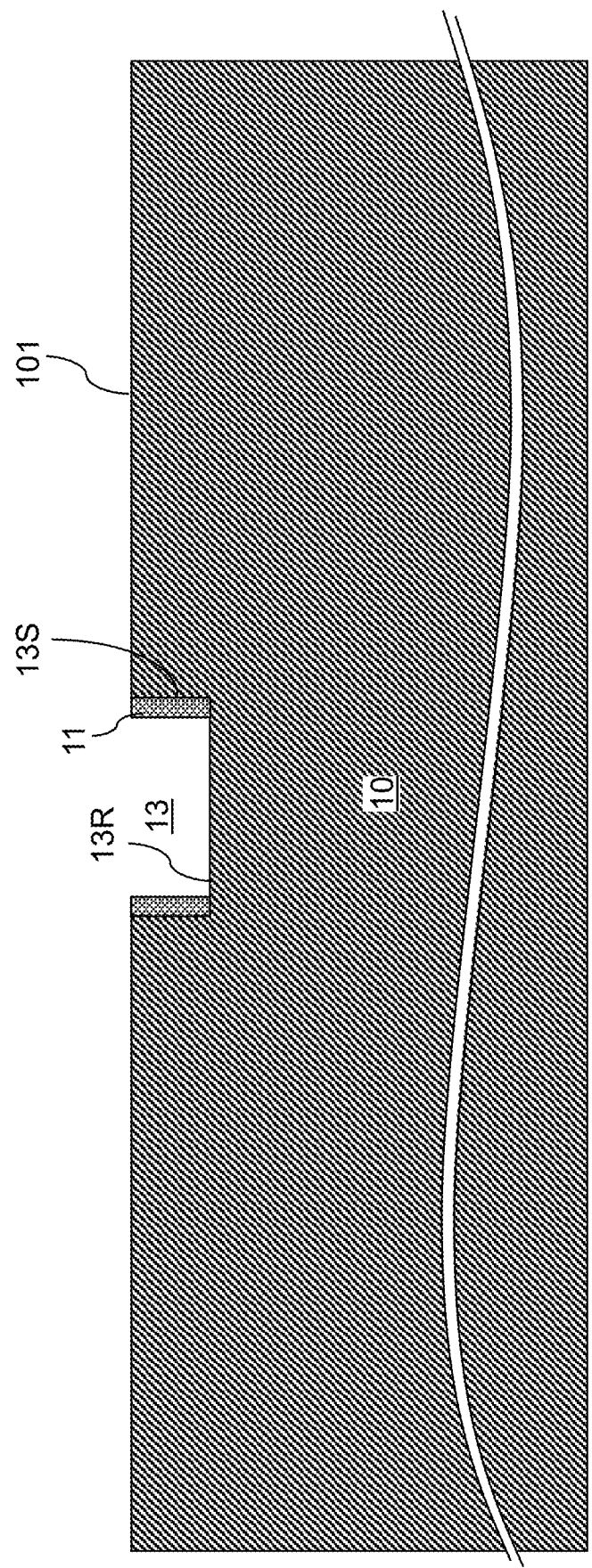
FIG. 2 is a vertical cross-sectional view of the exemplary structure after formation of a diffusion barrier spacer at a periphery of the recess cavity according to an embodiment of the present disclosure.

Referring to FIG. 2, a diffusion barrier spacer 11 (also referred to as a blocking spacer) including a diffusion barrier material may be formed at the periphery of the recess cavity 13. The diffusion barrier spacer 11 includes a material that blocks diffusion of oxygen therethrough. For example, the diffusion barrier spacer 11 may include, and/or may consist essentially of, silicon nitride. However, other suitable materials are within the contemplated scope of disclosure. In some embodiments, the diffusion barrier spacer 11 can be any material, and is configured to protect the sidewalls 13S of the recess cavity 13 from the following formed semiconductor oxide plates (plates 12A and 12B in FIG. 3). The diffusion barrier spacer 11 may be formed, for example, by conformally depositing a diffusion barrier material layer (such as a silicon nitride layer or a metallic nitride layer including a metallic nitride material (e.g., TaN, TiN, or WN)) on the recessed bottom surface 13R and the sidewalls 13S of the recess cavity 13 and on un-recessed portions of the first horizontal surface 101 of the semiconductor matrix material layer 10. In other embodiments, the diffusion barrier spacer 11 may be formed by denaturing portions of the semiconductor matrix material layer 10. The thickness of the diffusion barrier material layer may be in a range from 30 nm to 200 nm, although lesser and greater thicknesses may also be used. The diffusion barrier material may be anisotropically etched to remove horizontal portions of the diffusion barrier material layer deposited on the recessed bottom surface of the recess cavity and on un-recessed portions of the first horizontal surface 101 of the semiconductor matrix material layer 10. The remaining vertical portion of the diffusion barrier material layer constitutes the diffusion barrier spacer 11. In one embodiment, each sidewall 13S of the recess cavity 13 may contact a respective outer sidewall of the diffusion barrier spacer 11. The diffusion barrier spacer 11 may have a generally tubular shape, and thus, may be topologically homeomorphic to a torus, i.e., may be continuously deformed into a torus without creating a new hole or destroying a pre-existing hole.

Figure 3:
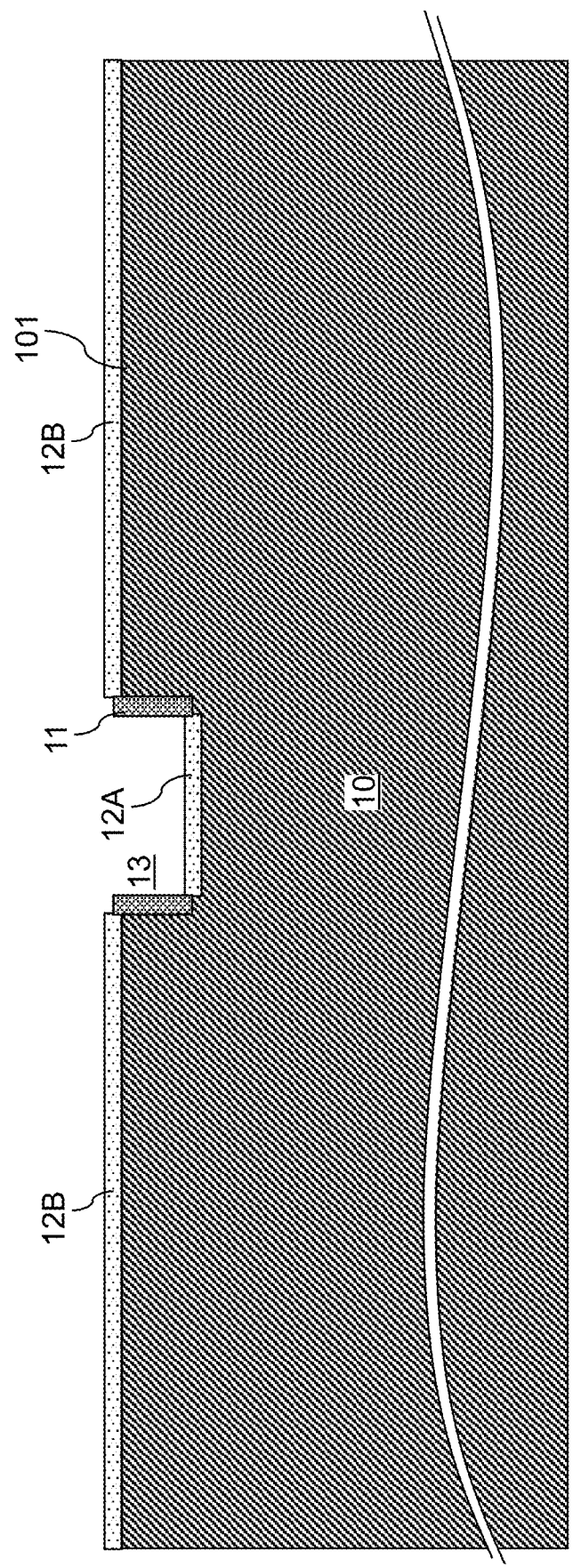
FIG. 3 is a vertical cross-sectional view of the exemplary structure after formation of semiconductor oxide plates according to an embodiment of the present disclosure.

Referring to FIG. 3, an oxidation process may be performed to convert physically exposed surface portions of the semiconductor matrix material layer 10 at the bottom of the recess cavity 13 and on un-recessed portions of the semiconductor matrix material layer 10 into semiconductor oxide plates (12A, 12B). For example, a thermal oxidation process may be performed to convert physically exposed surface portions of the semiconductor matrix material layer 10 into semiconductor oxide material portions. The diffusion barrier spacer 11 prevents diffusion of oxygen atoms therethrough to the semiconductor matrix material layer 10 that form the sidewalls of the recess cavity 13 during the oxidation process. The thermal oxidation process may use a dry oxidation process, a wet oxidation process, or a rapid thermal oxidation process. For example, dry oxidation is a thermal oxidation process using $O_2$ as an oxidant. Wet oxidation is a thermal oxidation using $H_2O$ as an oxidant. Rapid thermal oxidation is a thermal oxidation process that uses a single wafer processing chamber and provides thermal oxidation at a high temperature.

A first semiconductor oxide plate 12A may be formed at the bottom of the recess cavity 13 by conversion of the underlying surface portion of the semiconductor matrix material layer 10 into a dielectric semiconductor oxide material portion through the oxidation process. A second semiconductor oxide plate 12B may be formed on the first horizontal surface 101 of the un-recessed portion of the semiconductor matrix material layer 10 by conversion of the underlying surface portion of the semiconductor matrix material layer 10 into an additional dielectric semiconductor oxide material portion. The thickness of the first and second semiconductor oxide plates (12A, 12B) may be in a range from 50 nm to 500 nm, although lesser and greater thicknesses may also be used. In one embodiment, the first and second semiconductor oxide plates (12A, 12B) may comprise, and/or may consist essentially of, silicon oxide or an oxide of the semiconductor material of the semiconductor matrix material layer 10 in embodiments in which the semiconductor matrix material layer 10 includes any material other than silicon (such as a silicon-germanium alloy or a III-V compound semiconductor material).

Figure 4:
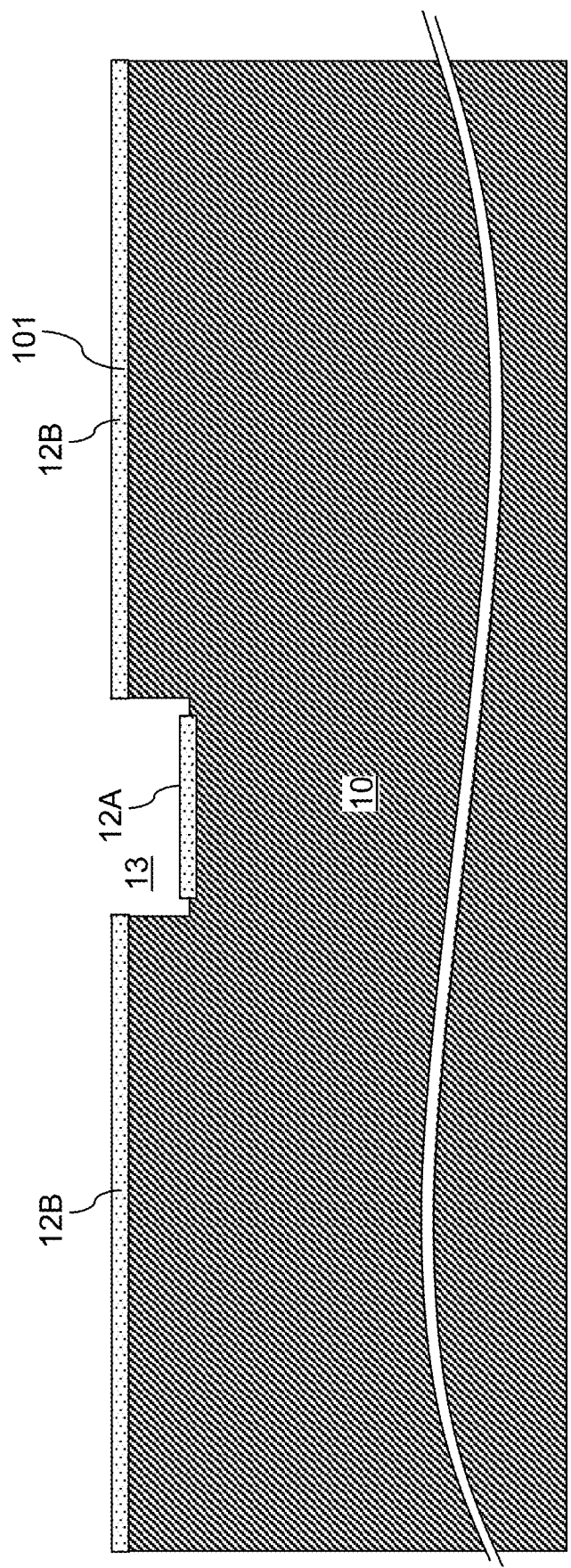
FIG. 4 is a vertical cross-sectional view of the exemplary structure after removal of the diffusion barrier spacer according to an embodiment of the present disclosure.

Referring to FIG. 4, the diffusion barrier spacer 11 may be removed selective to the materials of the first and second semiconductor oxide plates (12A, 12B) and the semiconductor matrix material layer 10. For example, if the diffusion barrier spacer 11 includes silicon nitride, a wet etch process using hot phosphoric acid may be performed to remove the diffusion barrier spacer 11 selective to the materials of the first and second semiconductor oxide plates (12A, 12B) and the semiconductor matrix material layer 10. Semiconductor surfaces of the semiconductor matrix material layer 10 may be physically exposed at the sidewalls of the recess cavity 13.

Figure 5B:
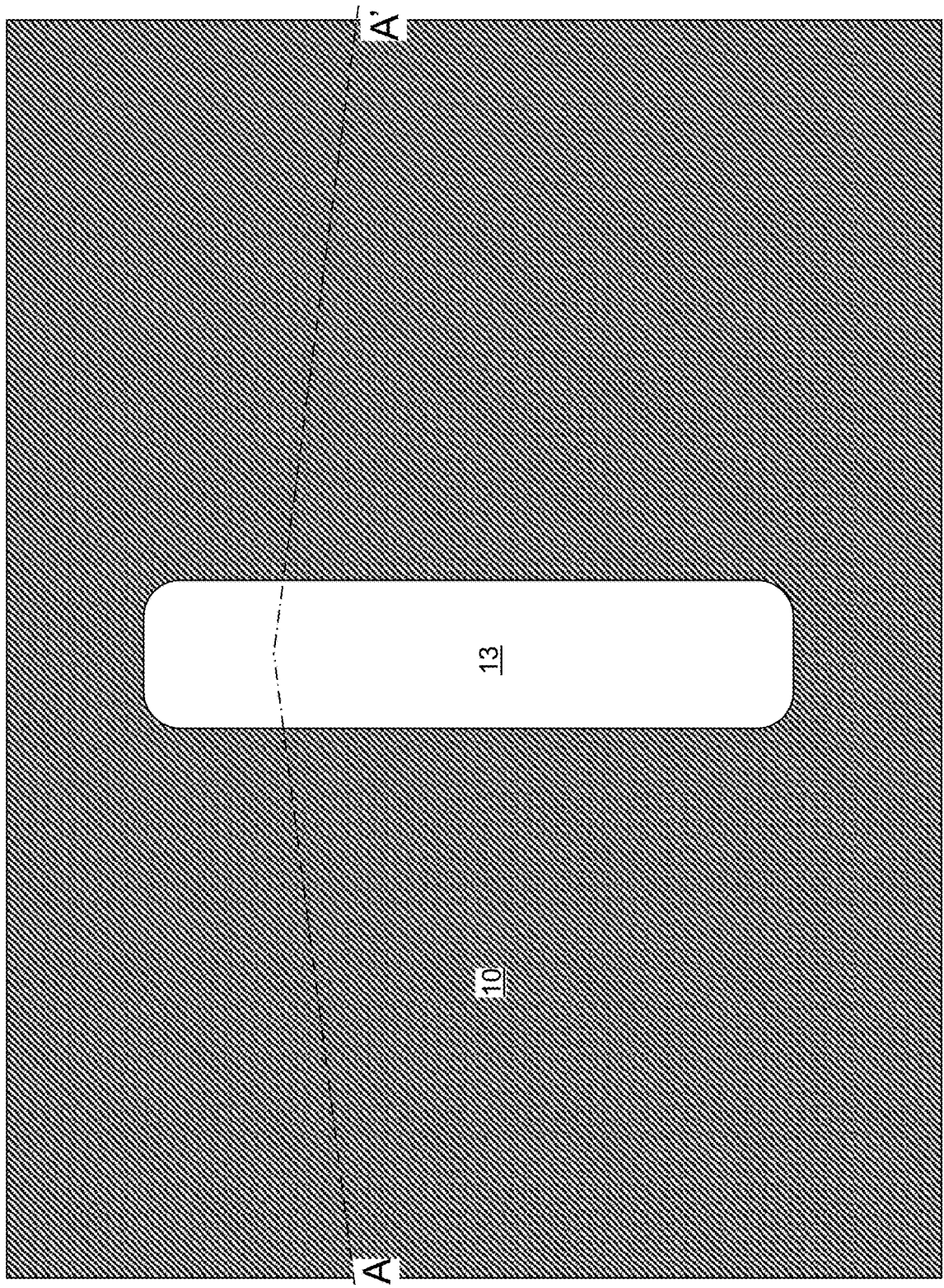
FIG. 5B is a horizontal cross-sectional view of the exemplary structure along the plane B-B' of FIG. 5A. The hinged vertical plane A-A' is the plane of the vertical cross-sectional view of FIG. 5A.

Referring to FIGS. 5A and 5B, the semiconductor matrix material layer 10 may be bonded to a cap substrate 20 via the second semiconductor oxide plate 12B. The cap substrate 20 may comprise a semiconductor substrate, a conductive substrate, a dielectric substrate, or a combination thereof. The cap substrate 20 may have a sufficient thickness to provide structural support during subsequent thinning of the semiconductor matrix material layer 10. For example, the thickness of the cap substrate 20 may be in a range from 60 microns to 1 mm, although thicker or thinner cap substrates may also be used.

The cap substrate 20 may be subsequently attached to the semiconductor matrix material layer 10. In one embodiment, a horizontal top surface of the cap substrate 20 includes a material that may be bonded to the semiconductor oxide material of the second semiconductor oxide plate 12B. The second semiconductor oxide plate 12B may be attached to the cap substrate 20 by bonding the second semiconductor oxide plate 12B to the cap substrate 20. A suitable bonding method may be used to bond the second semiconductor oxide plate 12B to the horizontal top surface of the cap substrate 20. For example, if the cap substrate 20 comprises a semiconductor top surface, semiconductor-to-oxide bonding such as silicon-to-silicon oxide bonding may be used to bond the cap substrate 20 to the second semiconductor oxide plate 12B. Alternatively, if the cap substrate 20 comprises a semiconductor oxide top surface (such as a silicon oxide top surface), oxide-to-oxide bonding such as silicon oxide-to-silicon oxide bonding may be used to bond the cap substrate 20 to the second semiconductor oxide plate 12B. Semiconductor-to-oxide bonding or oxide-to-oxide bonding may be performed by an anneal process at an elevated temperature, which may be in a range from 200 degrees Celsius to 600 degrees Celsius.

The semiconductor matrix material layer 10 may be subsequently thinned by grinding, polishing, and/or etching the backside surface of the semiconductor matrix material layer 10 located on the opposite side of the second semiconductor oxide plate 12B. A terminal step of the thinning process may include a polishing step that provides a horizontal planar surface on the backside (i.e., the polished side) of the semiconductor matrix material layer 10. The polished backside surface of the semiconductor matrix material layer 10 is herein referred to as a second horizontal surface 102. The thickness t of the semiconductor matrix material layer 10 as measured between the second horizontal surface 102 and the first horizontal surface 101 that contacts the second semiconductor oxide plate 12B may be in a range from 2 microns to 60 microns, such as from 4 microns to 30 microns, although lesser and greater thicknesses may also be used. The lower limit for the thickness t of the semiconductor matrix material layer 10 may be imposed by the minimum capacitance requirement for the capacitor structure to be subsequently formed, and the upper limit for the thickness t of the semiconductor matrix material layer 10 may be imposed by the process capability and economic viability of an etch process that is subsequently used to form comb trenches through the semiconductor matrix material layer 10.

Figure 6A:
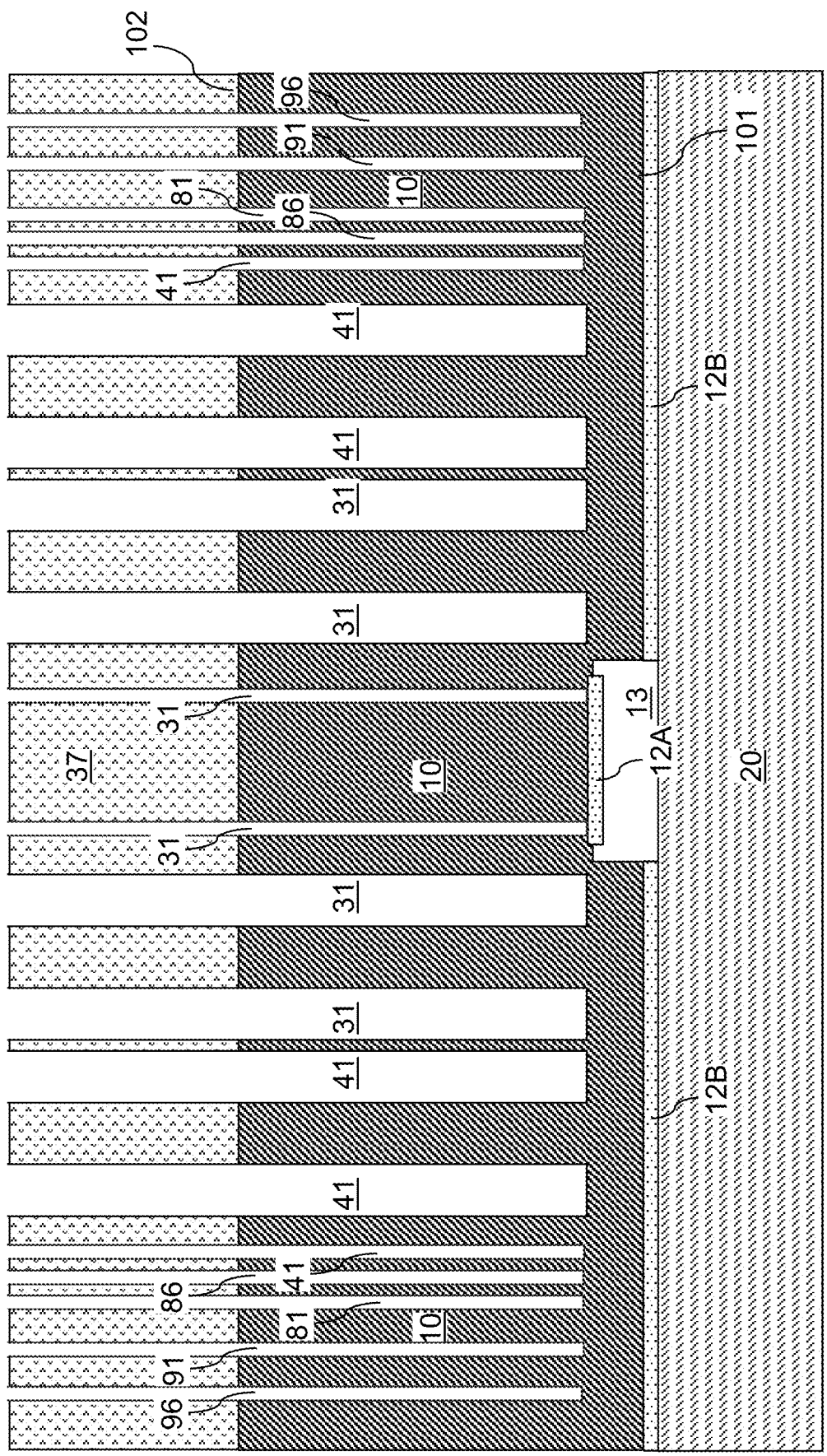
FIG. 6A is a vertical cross-sectional view of the exemplary structure after formation of comb trenches and moat trenches according to an embodiment of the present disclosure.
Figure 6B:
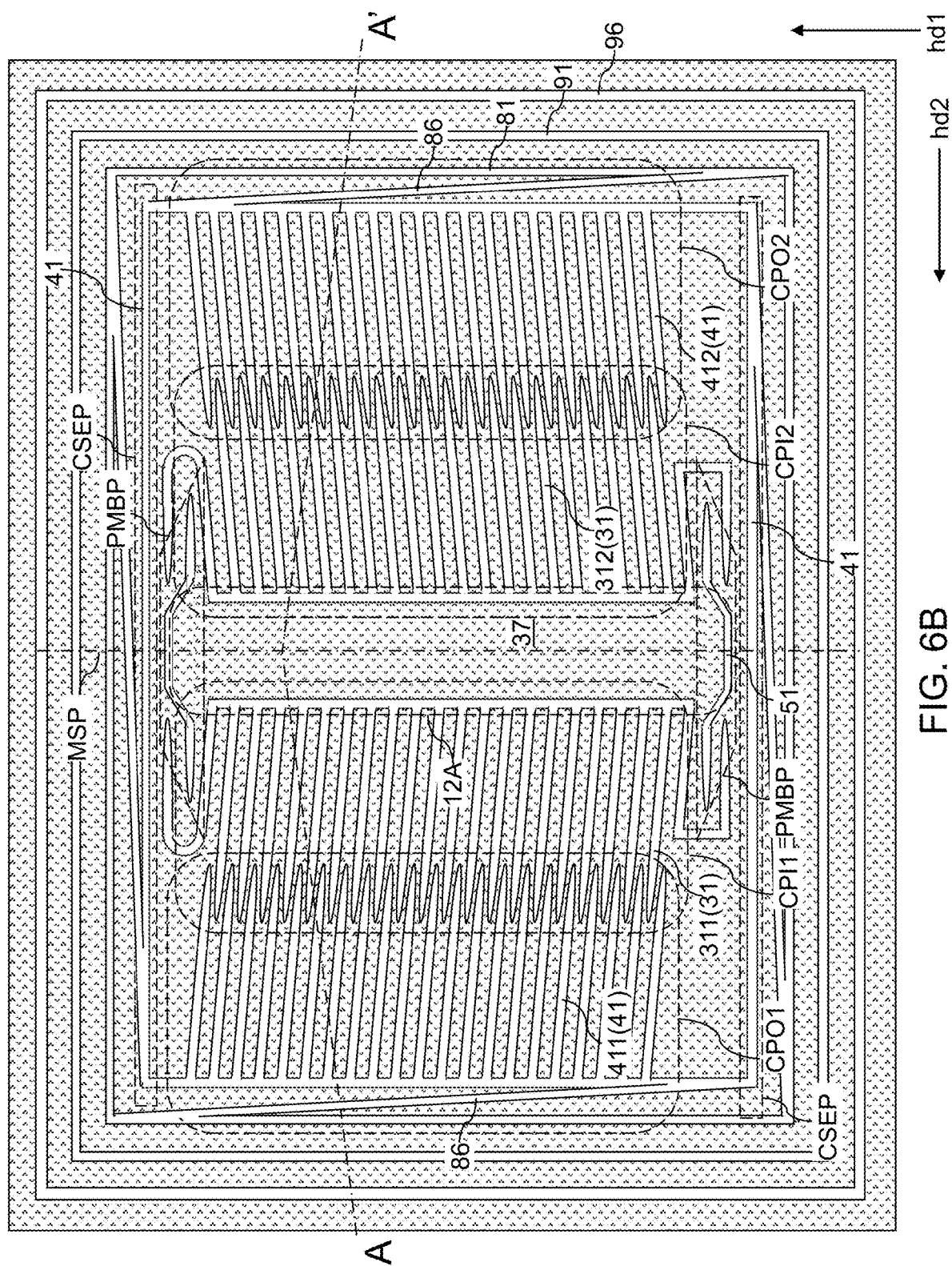
FIG. 6B is a horizontal cross-sectional view of the exemplary structure along the plane B-B' of FIG. 6A. The hinged vertical plane A-A' is the plane of the vertical cross-sectional view of FIG. 6A.
Figure 7A:
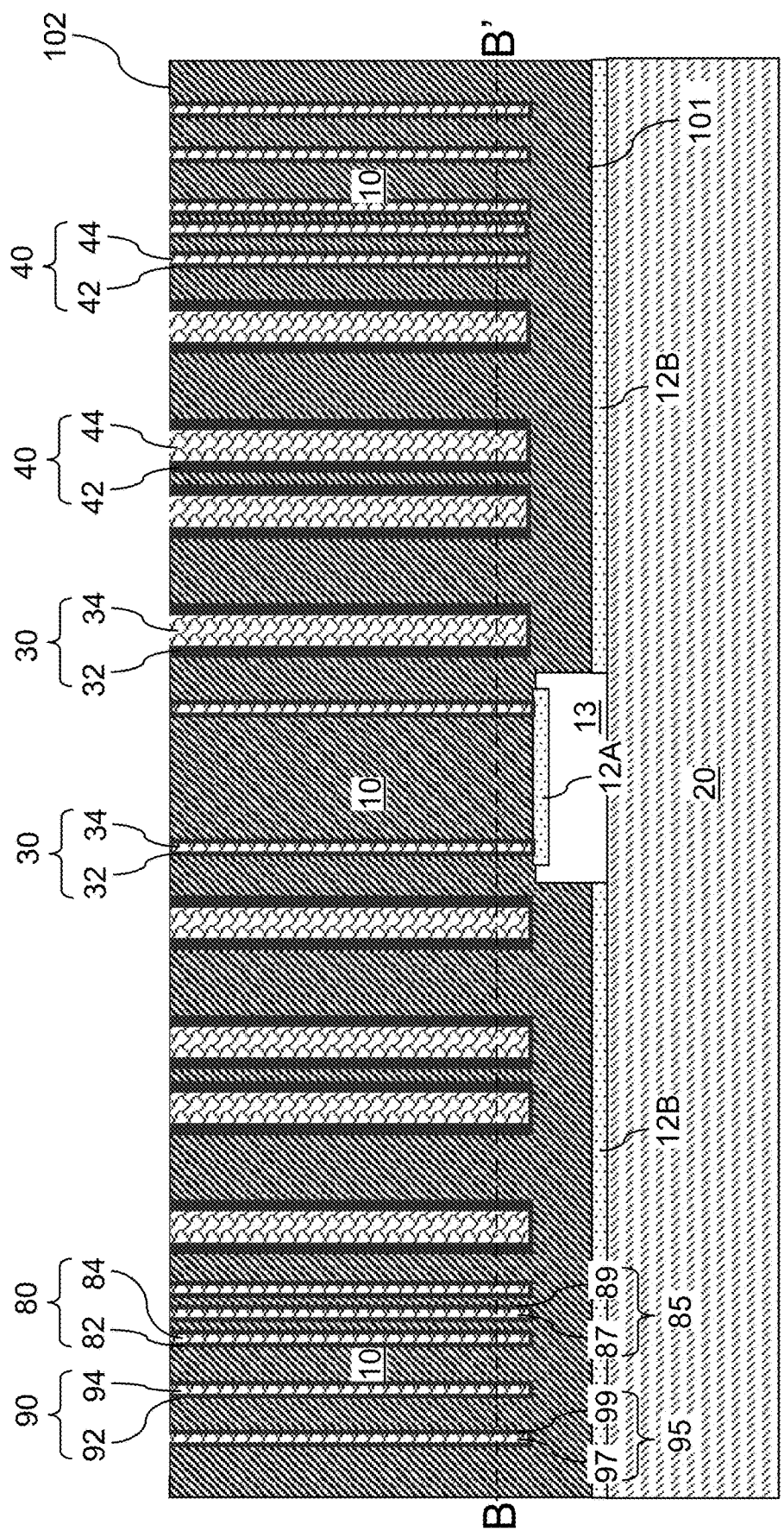
FIG. 7A is a vertical cross-sectional view of the exemplary structure after formation of comb structures and wall structures according to an embodiment of the present disclosure.
Figure 7B:
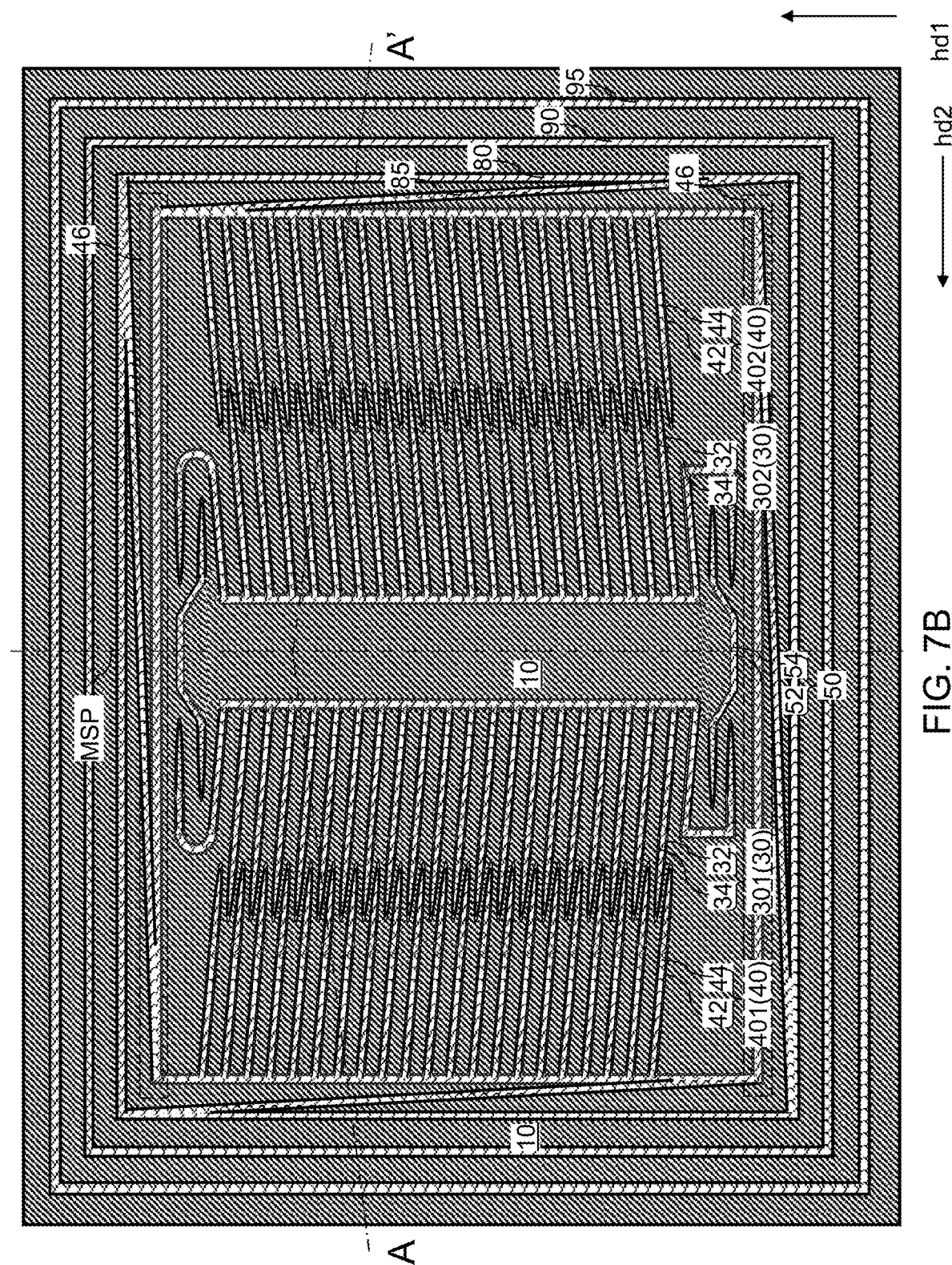
FIG. 7B is a horizontal cross-sectional view of the exemplary structure along the plane B-B' of FIG. 7A. The hinged vertical plane A-A' is the plane of the vertical cross-sectional view of FIG. 7A.

Referring to FIGS. 6A and 6B, a photoresist layer 37 may be applied over the second horizontal surface 102 of the semiconductor matrix material layer 10, and may be lithographically patterned to form openings therethrough. The pattern of the openings in the photoresist layer 37 may include two interdigitated comb patterns. Each interdigitated comb pattern may include an inner comb pattern (CPI1 or CPI2) and an outer comb pattern (CPO1 or CPO2). A first interdigitated comb pattern (CPI1, CPO1) includes a first inner comb pattern CPI1 and a first outer comb pattern CPO1. A second interdigitated comb pattern (CPI2, CPO2) includes a second inner comb pattern CPI2 and a second outer comb pattern CPO2.

Each inner comb pattern (CPI1 or CPI2) includes a respective comb shaft pattern and a respective comb teeth pattern that may be adjoined to the respective comb shaft pattern. Each comb shaft pattern of the inner comb patterns (CPI1, CPI2) may laterally extend along a first horizontal direction hd1 with, or without, a lateral undulation. Each outer comb pattern (CPO1 or CPO2) includes a respective comb shaft pattern and a respective comb teeth pattern that may be adjoined to the respective comb shaft pattern. Each comb shaft pattern of the outer comb patterns (CPO1, CPO2) may laterally extend along the first horizontal direction hd1 with, or without, a lateral undulation. The comb shaft patterns within the outer comb patterns (CPO1, CPO2) may be adjoined to comb shaft extension patterns CSEP that laterally extend along a second horizontal direction hd2 that is perpendicular to the first horizontal direction hd1. Specifically, end segments of each of the comb shaft patterns within the outer comb patterns (CPO1, CPO2) may be adjoined to end segments of the comb shaft extension patterns CSEP such that the set of the comb shaft patterns within the outer comb patterns (CPO1, CPO2) and the comb shaft extension patterns CSEP collectively form a generally rectangular shape, which defines an outer boundary of a cavity to be subsequently formed in the semiconductor matrix material layer 10.

The two interdigitated comb patterns may be arranged such that the two inner comb patterns (CPI1, CPI2) are proximal to each other and the two outer comb patterns (CPO1, CPO2) are distal from each other. In other words, the lateral separation distance between the comb shaft patterns of the two outer comb patterns (CPO1, CPO2) along the second horizontal direction hd2 is greater than the lateral separation distance between the comb shaft patterns of the two inner comb patterns (CPI1, CPI2).

An elongated region that is masked by the photoresist layer 37 may be provided between the comb shaft patterns of the two inner comb patterns (CPI1, CPI2), which includes an area of in which a proof mass (i.e., a center mass portion) is to be subsequently patterned from the semiconductor matrix material layer 10. The openings in the photoresist layer 37 may include proof mass barrier patterns PMBP, which are located at a boundary of the area in which the proof mass is to be subsequently formed. The comb shaft patterns of the two inner comb patterns (CPI1, CPI2) may have extension portions that wraps around the proof mass barrier patterns PMBP to provide an etchant constriction structure that impedes lateral etching of portions of the semiconductor matrix material layer 10 around the proof mass barrier patterns PMBP.

Each comb teeth pattern within the inner comb patterns (CPI1, CIP2) and the outer comb patterns (CPO1, CPO2) includes a plurality of comb tooth patterns that are parallel to one another. Each comb tooth pattern laterally extends away from a respective comb shaft pattern along a common lengthwise direction of the comb tooth patterns. Each tooth pattern may be elongated along a lengthwise direction and may have a stem region having a substantially uniform width and attached to a respective comb shaft pattern. Each tooth pattern may also have a pointed end segment having a width that gradually decreases with a distance from the respective comb shaft pattern. The common lengthwise direction of the comb tooth patterns within a comb teeth pattern may be at an angle in a range from 1 degree to 10 degrees, such as from 2 degrees to 8 degrees, with respective to the second horizontal direction hd2 in order to optimize change in the capacitance in a capacitor structure to be subsequently formed as a function of displacement of a movable structure to be subsequently formed. The pointed end segment of each comb tooth pattern may be advantageously used to increase the change in capacitance during displacement of the movable structure (i.e., center mass portion) to be subsequently formed.

The comb tooth patterns of the first inner comb pattern CPI1 and the comb tooth patterns of the first outer comb pattern CPO1 may be interdigitated with parallel lengthwise directions for all comb tooth patterns therein. The interdigitated region may include pointed end segments of the first inner comb pattern CPI1 and the comb tooth patterns of the first outer comb pattern CPO1. Likewise, comb tooth patterns of the second inner comb pattern CPI2 and the comb tooth patterns of the second outer comb pattern CPO2 may be interdigitated with parallel lengthwise directions for all comb tooth patterns therein. The interdigitated region may include pointed end segments of the second inner comb pattern CPI2 and the comb tooth patterns of the second outer comb pattern CPO2. The lengthwise directions of the comb tooth patterns of the second inner comb pattern CPI2 and the comb tooth patterns of the second outer comb pattern CPO2 may be tilted in an opposite direction from the second horizontal direction hd2 with respective to the lengthwise direction of the comb tooth patterns of the first inner comb pattern CPI1 and the comb tooth patterns of the first outer comb pattern CPO1. The overall pattern of the openings in the photoresist layer 37 may have a mirror symmetry plane (MSP) that extends along the first horizontal direction hd1.

In one embodiment, the area in which the proof mass is to be subsequently formed and the area of portions of the comb shaft patterns of the two inner comb patterns (CPI1, CPI2) that extend along the first horizontal direction hd1 may be located between a pair of lengthwise sidewalls of the first semiconductor oxide plate 12A in a top-down view.

While the present disclosure is described using an embodiment that describes an accelerometer, and patterns of the openings in the photoresist layer 37 may be optimized for forming an accelerometer, methods of the present disclosure may be used to form any microstructure including a movable structure including a proof mass (i.e., a movable center mass). As such, the design of the openings in the photoresist layer 37 may, or may not, be symmetric. Further, while two sets of interdigitated patterns are used to describe the present disclosure, a single interdigitated pattern or three or more interdigitated patterns may be used to form a single interdigitated combed structure or three or more interdigitated combed structures for a microstructure, which may be a MEMS device. Generally, the proof mass may be formed within the area defined by the periphery of the first semiconductor oxide plate 12A.

Further, the pattern in the photoresist layer 37 may include patterns of moat trenches that laterally surround the areas of the comb tooth patterns of the first inner comb pattern CPI1 and the comb tooth patterns of the first outer comb pattern CPO1. For example, the pattern of the moat trenches may include a pattern for a proximal moat trench that laterally surrounds the patterns of moat trenches that laterally surround the areas of the comb tooth patterns of the first inner comb pattern CPI1 and the comb tooth patterns of the first outer comb pattern CPO1; a pattern for an intermediate moat trench that laterally surrounds the pattern for the proximal moat trench; a pattern for a distal moat trench that laterally surrounds the pattern for the intermediate moat trench, and a pattern for suspension spring moat trenches connecting a respective pair of a segment of the pattern for proximal moat trench and a pattern of a comb shaft portion.

An anisotropic etch process may be performed to transfer the pattern of the openings in the photoresist layer 37 through an upper portion of the semiconductor matrix material layer 10. The anisotropic etch process may be a reactive ion etch process that etches unmasked portions of the semiconductor matrix material layer 10. Thus, the anisotropic etch process may replicate the pattern of the openings in the photoresist layer in the upper portion of the semiconductor matrix material layer 10. Comb trenches (31, 41, 51) may be formed through the upper portion of the semiconductor matrix material layer 10. Each of the comb trenches may extend from the second horizontal surface 102 of the semiconductor matrix material layer 10 toward the first horizontal surface 101 of the semiconductor matrix material layer 10. In one embodiment, the comb trenches (31, 41, 51) vertically extend to the horizontal plane including the top surface of the first semiconductor oxide plate 12A, i.e., the horizontal plane including the horizontal interface between the first semiconductor oxide plate 12A and the semiconductor matrix material layer 10. The anisotropic etch process may have an etch chemistry for etching the semiconductor material of the semiconductor matrix material layer 10 selective to the material of the first semiconductor oxide plate 12A. For example, the anisotropic etch process may have an etch chemistry that uses $HBr/NF_3/O_2/SF_6$.

Two interdigitated comb trenches may be formed, which replicate the pattern of the two interdigitated comb patterns. Each interdigitated comb trench may include an inner comb trench 31 and an outer comb trench 41. A first interdigitated comb trench includes a first inner comb trench 311 and a first outer comb trench 411 located on one side of the mirror symmetry plane (MSP). A second interdigitated comb trench includes a second inner comb trench 312 and a second outer comb trench 412 located on the opposite side of the mirror symmetry plane (MSP).

Each inner comb trench 31 includes a respective comb trench shaft portion that replicates a comb shaft pattern and a respective comb trench teeth portion that replicates a comb teeth pattern and is adjoined to the respective comb trench shaft portion. Each comb trench shaft portion of the inner comb trenches 31 may laterally extend along the first horizontal direction hd1 with, or without, a lateral undulation. Each outer comb trench 41 includes a respective comb trench shaft portion that replicated a comb shaft pattern and a respective comb trench teeth portion that replicates a comb teeth pattern and is adjoined to the respective comb trench shaft portion. Each comb trench shaft portion of the outer comb trenches 41 may laterally extend along the first horizontal direction hd1 with, or without, a lateral undulation. The comb trench shaft portions within the outer comb trenches 41 may be adjoined to comb trench extension portions 43 that laterally extend along the second horizontal direction hd2. Specifically, end segments of each of the comb trench shaft portions within the outer comb trenches 41 may be adjoined to end segments of the comb trench extension portions 43 such that the set of the comb trench shaft portions within the outer comb trenches 41 and the comb trench extension portions 43 collectively form a generally rectangular shape, which defines an outer boundary of a cavity to be subsequently formed in the semiconductor matrix material layer 10.

The two interdigitated comb trenches (31, 41) may be arranged such that the two inner comb trenches (311, 312) are proximal to each other and the two outer comb trenches (411, 412) are distal from each other. In other words, the lateral separation distance between the comb trench shaft portions of the two outer comb trenches (411, 412) along the second horizontal direction hd2 is greater than the lateral separation distance between the comb trench shaft portions of the two inner comb trenches (311, 312).

A first portion of the semiconductor matrix material layer 10 having a generally elongated rectangular shape may be provided between the comb trench shaft portions of the two inner comb trenches (311, 312), which corresponds to a region from which a proof mass (i.e., a center mass portion) is to be subsequently patterned. Proof mass barrier trenches 51 may be formed underneath the openings in the photoresist layer 37 that include the proof mass barrier patterns (PMBP), which are located at a boundary of the area in which the proof mass is to be subsequently formed. A pair of proof mass barrier trenches 51 may be laterally spaced apart along the first horizontal direction hd1. The comb trench shaft portions of the two inner comb trenches (311, 312) may have extension portions that wraps around the proof mass barrier trenches 51, and may be subsequently used to form a structure that constricts lateral etching of the semiconductor matrix material layer 10 during a subsequent isotropic etch process.

Each comb trench teeth portion within the inner comb trenches 31 and the outer comb trenches 41 may include a plurality of comb trench tooth portions that are parallel to one another. Each comb trench tooth portion laterally extends away from a respective comb trench shaft portion along a common lengthwise direction of the comb trench tooth portions. Each comb trench tooth portion may be elongated along a lengthwise direction and may have a stem region having a substantially uniform width and attached to a respective comb trench shaft portion, and may have a pointed end segment having a width that gradually decreases with a distance from the respective comb trench shaft portion. The common lengthwise direction of the comb trench tooth portions within a comb trench teeth portion may be at an angle in a range from 1 degree to 10 degrees, such as from 2 degrees to 8 degrees. The pointed end segment of each comb trench tooth portion may be advantageously used to increase the change in capacitance during displacement of the movable structure to be subsequently formed.

The comb trench tooth portions of the first inner comb trench 311 and the comb trench tooth portions of the first outer comb trench 411 may be interdigitated with parallel lengthwise directions for all comb trench tooth portions therein. The interdigitated region may include pointed end segments of the first inner comb trench 311 and the comb trench tooth portions of the first outer comb trench 411. Likewise, comb trench tooth portions of the second inner comb trench 312 and the comb trench tooth portions of the second outer comb trench 412 may be interdigitated with parallel lengthwise directions for all comb trench tooth portions therein. The interdigitated region may include pointed end segments of the second inner comb trench 312 and the comb trench tooth portions of the second outer comb trench 412. The lengthwise directions of the comb trench tooth portions of the second inner comb trench 312 and the comb trench tooth portions of the second outer comb trench 412 may be tilted in an opposite direction from the second horizontal direction hd2 with respect to the lengthwise direction of the comb trench tooth portions of the first inner comb trench 311 and the comb trench tooth portions of the first outer comb trench 411. The overall pattern of the comb trenches (31, 41, 51) may have a mirror symmetry plane (MSP) that extends along the first horizontal direction hd1.

In one embodiment, the area in which the proof mass is to be subsequently formed and the area of portions of the comb trench shaft portions of the two inner comb trenches (311, 312) that laterally extend along the first horizontal direction hd1 may be located between a pair of lengthwise sidewalls of the first semiconductor oxide plate 12A in a top-down view. The photoresist layer 37 may be subsequently removed, for example, by ashing.

Moat trenches (81, 91, 96, 86) may laterally surround the areas of the inner comb trenches 31 and the outer comb trenches 41. For example, the moat trenches (81, 91, 96, 86) may include a proximal moat trench 81 that laterally surrounds the inner comb trenches 31 and the outer comb trenches 41; an intermediate moat trench 91 that laterally surrounds the proximal moat trench 81; a distal moat trench 96 that laterally surrounds the intermediate moat trench 91, and suspension spring moat trenches 86 connecting a respective pair of a segment of the proximal moat trench 81 and a comb trench shaft portion of the two outer comb trenches (411, 412).

Referring to FIGS. 7A, 7B, 8A-8H, and 9A-9H, at least one trench fill material can be deposited in each trench in the semiconductor matrix material layer 10. Generally, the at least one trench fill material can be deposited in a first trench (such as an inner comb trench 31) and a second trench (such as an outer comb trench 41). According to an aspect of the present disclosure, the at least one trench fill material comprises at least one metallic material. In one embodiment, the metallic material can be selected from an elemental metal (such as a transition metal), an intermetallic alloy of at least two elemental metals, a metal-semiconductor alloy, and a conductive metallic nitride material (such as a conductive metallic nitride material). In one embodiment, the at least one trench fill material may include a single metallic material or may include a plurality of metallic materials that are deposited in multiple deposition processes.

Generally, the at least one trench fill material may be deposited in the comb trenches (31, 41, 51) and the moat trenches (81, 91, 96, 86), and over the second horizontal surface 102 of the semiconductor matrix material layer 10. The at least one trench fill material may additionally include at least one semiconductor material, and/or at least one dielectric material. In one embodiment, each of the at least one trench fill material may be deposited by a respective conformal deposition process such as a chemical vapor deposition process. In one embodiment, the total thickness of the at least one trench fill material can be greater than one half of the maximum width of the various trenches in the semiconductor matrix material layer 10.

Excess portions of the at least one trench fill material can be removed, partly or fully, from above the second horizontal surface 102 of the semiconductor matrix material layer 10 using a planarization process. The planarization process may use chemical mechanical planarization (CMP) and/or a recess etch process. Each remaining portion of the at least one trench fill material in a respective trench comprises a comb structure (30, 40). Specifically, the comb structures (30, 40) comprise a movable comb structure 30 and a stationary comb structure 40. A first interdigitated comb structure (301, 401) including a first movable comb structure 301 and a first stationary comb structure 401 may be formed on one side of the mirror symmetry plane (MSP), and a second interdigitated comb structure (302, 402) including a second movable comb structure 302 and a second stationary comb structure 402 may be formed on the opposite side of the mirror symmetry plane MSP. A barrier structure 50 may be formed in each proof mass barrier trench 51.

Figure 8C:
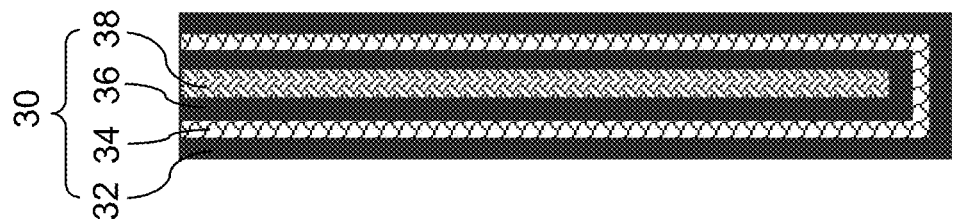
FIGS. 8A-8H are vertical cross-sectional views of various configurations of a movable comb finger according to various embodiments of the present disclosure.
Figure 8B:
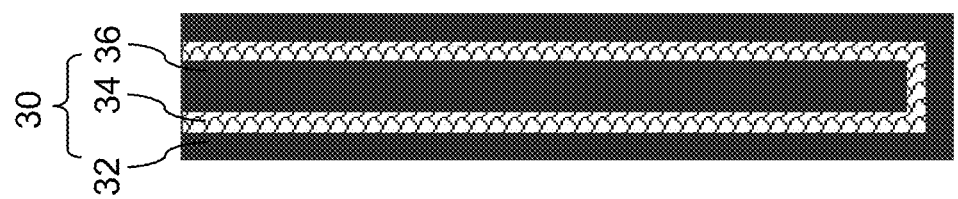
Figure 8A:
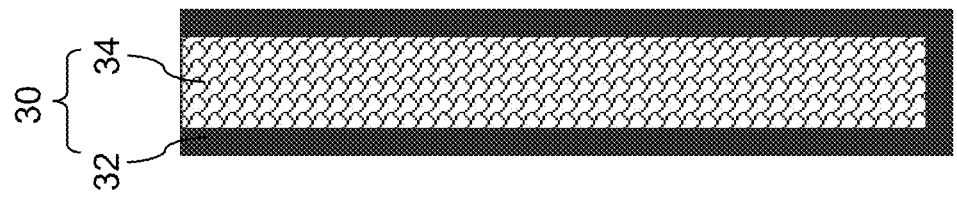
Figure 9C:
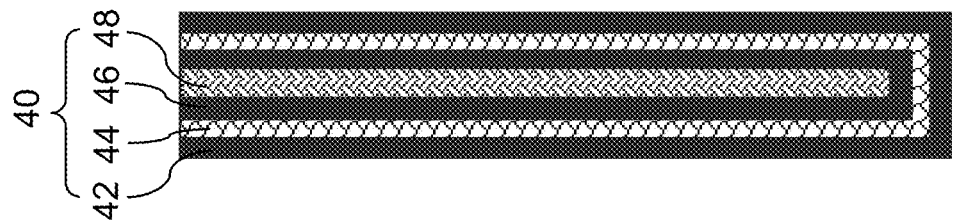
FIGS. 9A-9H are vertical cross-sectional views of various configurations of a stationary comb finger according to various embodiments of the present disclosure.
Figure 9B:
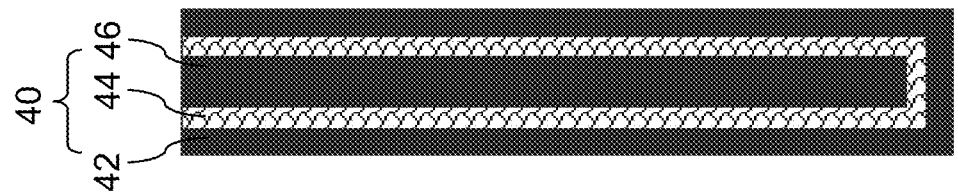
Figure 9A:
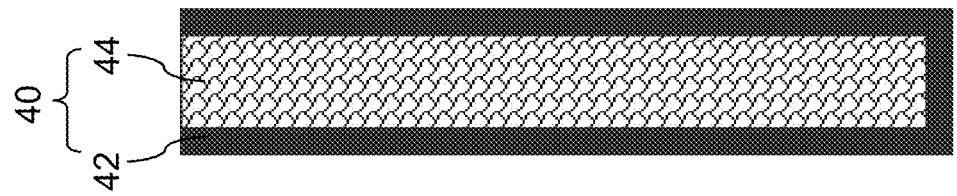

In one embodiment, the at least one trench fill material may include a metallic material and a semiconductor material. FIGS. 8A and 9A illustrate a first configuration of a movable comb finger of a movable comb structure 30 and a stationary comb finger of a stationary comb structure 40, respectively. In the first configuration, each movable comb finger may include a combination of a metallic material portion 32 and a semiconductor material portion 34 in contact with the metallic material portion 32, and each stationary comb finger may include a combination of a metallic material portion 42 and a semiconductor material portion 44 in contact with the metallic material portion 42.

In one embodiment, the at least one trench fill material may include a plurality of metallic materials and a semiconductor material. FIGS. 8B and 9B illustrate a second configuration of a movable comb finger of a movable comb structure 30 and a stationary comb finger of a stationary comb structure 40, respectively. In the second configuration, each movable comb finger may include a combination of a first metallic material portion 32, a semiconductor material portion 34 in contact with the first metallic material portion 32, and a second metallic material portion 36 in contact with the semiconductor material portion 34. Each stationary comb finger may include a combination of a first metallic material portion 42, a semiconductor material portion 44 in contact with the first metallic material portion 42, and a second metallic material portion 46 in contact with the semiconductor material portion 44. In one embodiment, each semiconductor material portion (34, 44) comprises a doped polycrystalline silicon-containing material having a doping of p-type or n-type. For example, each semiconductor material portion (34, 44) may include doped polysilicon.

In one embodiment, the at least one trench fill material may include a plurality of metallic materials and a plurality of semiconductor materials. FIGS. 8C and 9C illustrate a third configuration of a movable comb finger of a movable comb structure 30 and a stationary comb finger of a stationary comb structure 40, respectively. In the third configuration, each movable comb finger may include a combination of a first metallic material portion 32, a first semiconductor material portion 34 in contact with the first metallic material portion 32, a second metallic material portion 36 in contact with the first semiconductor material portion 34, and a second semiconductor material portion 38 in contact with the second metallic material portion 36. Each stationary comb finger may include a combination of a first metallic material portion 42, a first semiconductor material portion 44 in contact with the first metallic material portion 42, a second metallic material portion 46 in contact with the first semiconductor material portion 44, and a second semiconductor material portion 48 in contact with the second metallic material portion 46. In one embodiment, each semiconductor material portion (34, 44, 38, 48) comprises a doped polycrystalline silicon-containing material having a doping of p-type or n-type. For example, each semiconductor material portion (34, 44, 38, 48) may include doped polysilicon.

In some embodiments, a dielectric liner (33, 43) (illustrated in FIGS. 8D-8F, 8H, 9D-9F, and 9H) may be conformally formed on physically exposed surfaces of the semiconductor matrix material layer 10 in the comb trenches (31, 41, 51), in the moat trenches (81, 91, 96, 86), and over the second horizontal surface 102 of the semiconductor matrix material layer 10. In one embodiment, the dielectric liner (33, 43) may be formed by an oxidation process that converts physically exposed surface portions of the semiconductor matrix material layer 10 into a semiconductor oxide liner such as silicon oxide liner. Alternatively, the dielectric liner (33, 43) may be formed by conformally depositing a dielectric material such as silicon oxide, silicon nitride, a dielectric metal oxide (such as aluminum oxide and/or hafnium oxide). The thickness of the dielectric liner (33, 43) may be in a range from 4 nm to 100 nm, such as from 6 nm to 20 nm. Generally, the thickness of the dielectric liner (33, 43) may be optimized to maximize the capacitive coupling between comb structures to be subsequently formed, and to minimize leakage current through the dielectric liner layer.

Figure 8F:
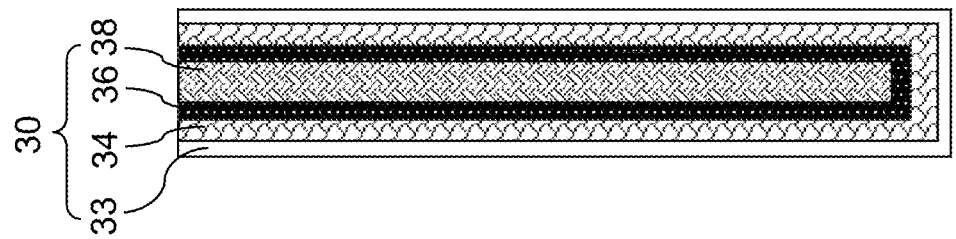
Figure 8E:
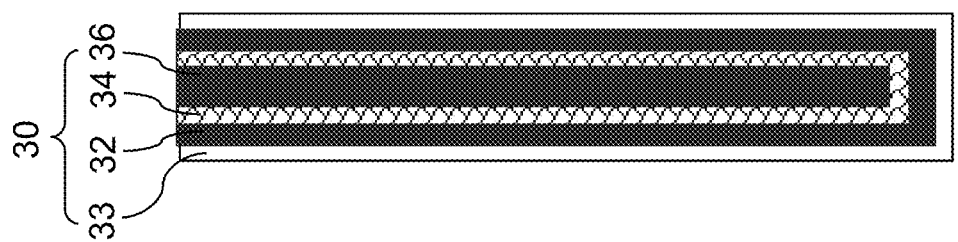
Figure 8D:
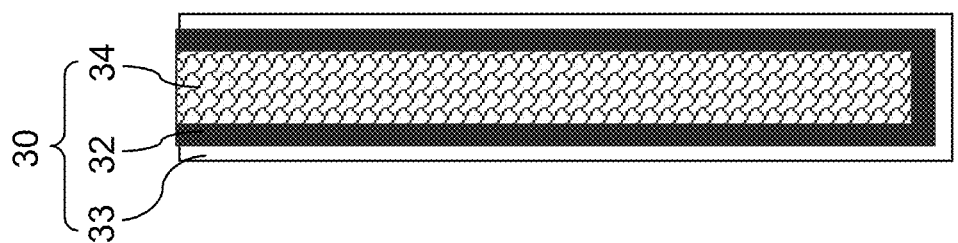
Figure 9F:
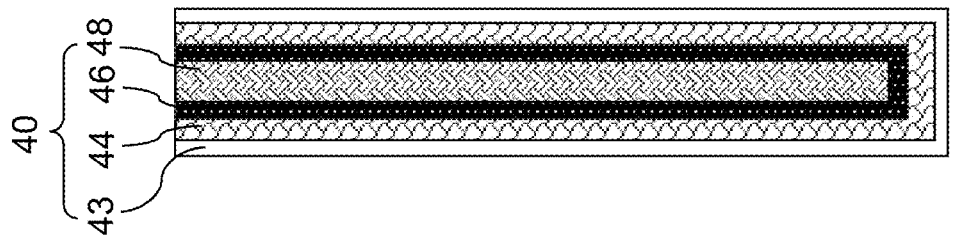
Figure 9E:
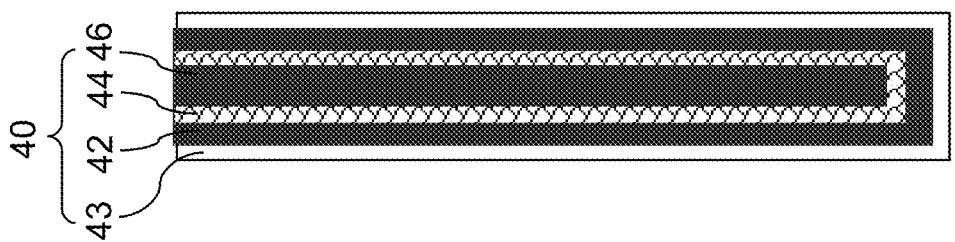
Figure 9D:
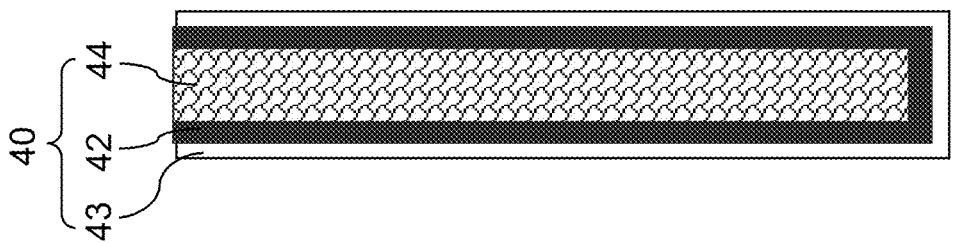

In one embodiment, the at least one trench fill material may include a dielectric liner (33 or 43), a metallic material, and a semiconductor material. FIGS. 8D and 9D illustrate a fourth configuration of a movable comb finger of a movable comb structure 30 and a stationary comb finger of a stationary comb structure 40, respectively. In the fourth configuration, each movable comb finger may include a combination of a dielectric liner 33, a metallic material portion 32, and a semiconductor material portion 34 in contact with the metallic material portion 32. Each stationary comb finger may include a combination of a dielectric liner 43, a metallic material portion 42, and a semiconductor material portion 44 in contact with the metallic material portion 42.

In one embodiment, the at least one trench fill material may include a dielectric liner (33 or 42), a plurality of metallic materials, and a semiconductor material. FIGS. 8E and 9E illustrate a fifth configuration of a movable comb finger of a movable comb structure 30 and a stationary comb finger of a stationary comb structure 40, respectively. In the fifth configuration, each movable comb finger may include a combination of a dielectric liner 33, a first metallic material portion 32, a semiconductor material portion 34 in contact with the first metallic material portion 32, and a second metallic material portion 36 in contact with the semiconductor material portion 34. Each stationary comb finger may include a combination of a dielectric liner 43, a first metallic material portion 42, a semiconductor material portion 44 in contact with the first metallic material portion 42, and a second metallic material portion 46 in contact with the semiconductor material portion 44. In one embodiment, each semiconductor material portion (34, 44) comprises a doped polycrystalline silicon-containing material having a doping of p-type or n-type. For example, each semiconductor material portion (34, 44) may include doped polysilicon.

In one embodiment, the at least one trench fill material may include a dielectric liner (33 or 42), a plurality of metallic materials, and a plurality of semiconductor materials. FIGS. 8F and 9F illustrate a sixth configuration of a movable comb finger of a movable comb structure 30 and a stationary comb finger of a stationary comb structure 40, respectively. In the sixth configuration, each movable comb finger may include a combination of a dielectric liner 33, a first metallic material portion 32, a first semiconductor material portion 34 in contact with the first metallic material portion 32, a second metallic material portion 36 in contact with the first semiconductor material portion 34, and a second semiconductor material portion 38 in contact with the second metallic material portion 36. Each stationary comb finger may include a combination of a dielectric liner 43, a first metallic material portion 42, a first semiconductor material portion 44 in contact with the first metallic material portion 42, a second metallic material portion 46 in contact with the first semiconductor material portion 44, and a second semiconductor material portion 38 in contact with the second metallic material portion 46. In one embodiment, each semiconductor material portion (34, 44, 38, 48) comprises a doped polycrystalline silicon-containing material having a doping of p-type or n-type. For example, each semiconductor material portion (34, 44, 38, 48) may include doped polysilicon.

Figure 8H:
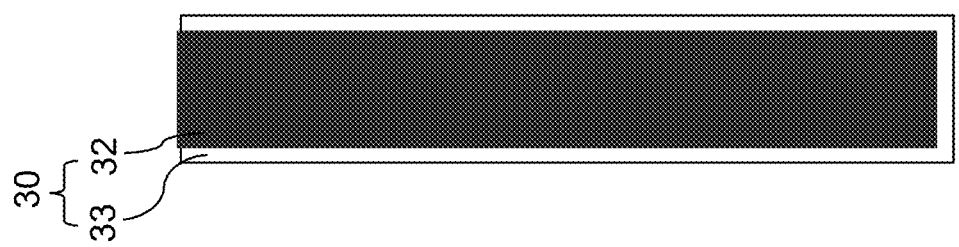
Figure 8G:
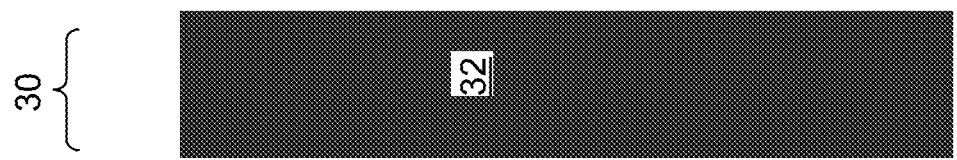
Figure 9H:
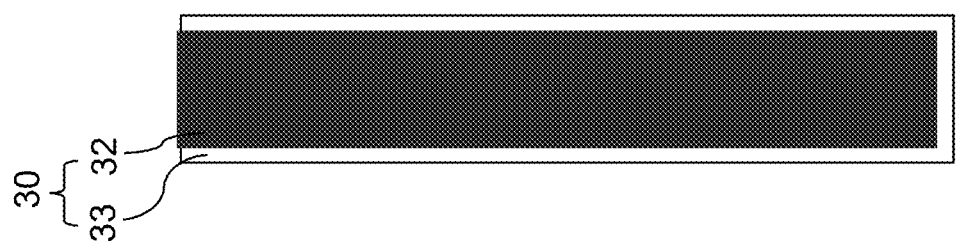
Figure 9G:
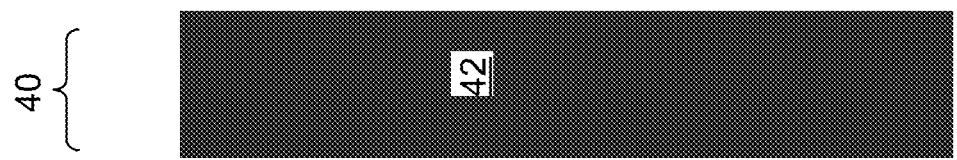

In one embodiment, the at least one trench fill material may consist of a metallic material. FIGS. 8G and 9G illustrate a seventh configuration of a movable comb finger of a movable comb structure 30 and a stationary comb finger of a stationary comb structure 40, respectively. In the seventh configuration, each movable comb finger may consist of a metallic material portion 32. Each stationary comb finger may consist of a metallic material portion 42.

In one embodiment, the at least one trench fill material may include a combination of a dielectric liner (33 or 43) and a metallic material. FIGS. 8H and 9H illustrate an eighth configuration of a movable comb finger of a movable comb structure 30 and a stationary comb finger of a stationary comb structure 40, respectively. In the eighth configuration, each movable comb finger may include a combination of a dielectric liner 33 and a metallic material portion 32. Each stationary comb finger may include a combination of a dielectric liner 43 and a metallic material portion 42.

Generally, a metallic material portion (32, 36) in a movable comb structure 30 may continuously extend through each of the movable comb fingers as a continuous structure. Likewise, metallic material portion (42, 46) in a stationary comb structure 40 may continuously extend through each of the stationary comb fingers as a continuous structure. In one embodiment, a metallic material portion (32, 36) in a movable comb structure 30 may include a region having a uniform width in each of the movable comb fingers as a continuous structure. Likewise, metallic material portion (42, 46) in a stationary comb structure 40 may include a region having a uniform width in each of the stationary comb fingers as a continuous structure. In one embodiment, each metallic material portion (32, 36) in a movable comb structure 30 may have a metallic composition, and a metallic material portion (42, 46) in a stationary comb structure 40 may include an additional metallic material portion having a same material composition as the metallic material portions (32, 36) in the movable comb structures 30.

Generally, various dielectric liners (33, 43, 52, 82, 92, 87, 97) illustrated in FIGS. 7A, 7B, 8D-8F, 8H, 9D-9F, and 9H may be formed. The dielectric liners (33, 43, 52, 82, 92, 87, 97) include inner dielectric liners 33 that are formed within a respective one of the inner comb trenches 31, outer dielectric liners 43 that are formed within a respective one of the outer comb trenches 41, barrier dielectric liners 52 that are formed within a respective one of the proof mass barrier trenches 51, and moat trench dielectric liners (82, 92, 87, 97). Barrier conductive fill material portions 54 may be formed within a respective one of the proof mass barrier trenches 51, and moat trench fill material portions (84, 94, 89, 99) may be formed within a respective one of the moat trenches (81, 91, 86, 96). A barrier structure 50 including a barrier dielectric liner 52 and a barrier conductive fill material portion 54 may be formed in each proof mass barrier trench 51. The moat trench dielectric liners (82, 92, 87, 97) may include an inner dielectric liner 82 that may be formed in the proximal moat trench 81, an intermediate dielectric liner 92 that may be formed in the intermediate moat trench 91, an outer dielectric liner 97 that may be formed in the distal moat trench 96, and suspension spring dielectric liners 87 that may be formed in the suspension spring moat trenches 86.

The combination of inner dielectric liner 82 and the proximal fill material portion 84 constitutes a proximal wall structure 80. The combination of the intermediate dielectric liner 92 and the intermediate fill material portion 94 constitutes an intermediate wall structure 90. The combination of the outer dielectric liner 97 and the distal fill material portion 99 constitutes a distal wall structure 95. Each combination of a suspension spring dielectric liner 87 and a suspension spring fill material portion 89 constitutes a suspension wall structure 85.

Generally, each of the comb structures (30, 40) may comprise a respective dielectric liner (33 or 43) and a respective conductive fill material portion (32, 34, 36, 38, 42, 44, 46, 48). Each of the comb structures (30, 40) extends from a second horizontal surface 102 of the semiconductor matrix material layer 10 toward the first horizontal surface 101 of the semiconductor matrix material layer 10 located at an interface with the second semiconductor oxide plate 12B. Each dielectric liner (33, 43) may be a patterned portion of the dielectric liner layer, and each conductive fill material portion (32, 34, 36, 38, 42, 44, 46, 48) may be a remaining portion of a respective conductive fill material. In one embodiment, the comb structures (30, 40) comprise a pair of movable comb structures (301, 302) that may be laterally spaced apart by a first portion of the semiconductor matrix material layer 10 and a pair of stationary comb structures (401, 402) that are interdigitated with the pair of movable comb structures (301, 302). Comb shaft portions of the stationary comb structures (401, 402) extend along the first horizontal direction hd1 and then along the second horizontal direction hd2 to be adjoined to one another, thereby defining a substantially rectangular area that is entirely laterally enclosed by the combined comb shaft portions of the stationary comb structures (401, 402). In other words, the comb shaft portions of the stationary comb structures (401, 402) may constitute a frame that laterally encloses all teeth portions of the stationary comb structures (401, 402) and the entirety of the movable comb structures (301, 302).

Two interdigitated comb structures (30, 40) may be formed, which have horizontal cross-sectional shapes that replicate the pattern of the two interdigitated comb patterns. Each interdigitated comb structure (30, 40) may include a movable comb structure 30 and a stationary comb structure 40. A first interdigitated comb structure includes a first movable comb structure 301 and a first stationary comb structure 401 located on one side of the mirror symmetry plane (MSP). A second interdigitated comb structure includes a second movable comb structure 302 and a second stationary comb structure 402 located on the opposite side of the mirror symmetry plane (MSP).

Each movable comb structure 30 includes a respective comb structure shaft portion that replicates a comb shaft pattern and a respective comb structure teeth portion that replicates a comb teeth pattern and is adjoined to the respective comb structure shaft portion. Each comb structure shaft portion of the movable comb structures 30 may laterally extend along the first horizontal direction hd1 with, or without, a lateral undulation. Each stationary comb structure 40 includes a respective comb structure shaft portion that replicated a comb shaft pattern and a respective comb structure teeth portion that replicates a comb teeth pattern and is adjoined to the respective comb structure shaft portion. Each comb structure shaft portion of the stationary comb structures 40 may laterally extend along the first horizontal direction hd1 with, or without, a lateral undulation. The comb structure shaft portions within the stationary comb structures 40 may be adjoined to comb structure extension portions 46 that laterally extend along the second horizontal direction hd2. Specifically, end segments of each of the comb structure shaft portions within the stationary comb structures 40 may be adjoined to end segments of the comb structure extension portions 46 such that the set of the comb structure shaft portions within the stationary comb structures 40 and the comb structure extension portions 46 collectively form a generally rectangular shape, which defines an outer boundary of a cavity to be subsequently formed in the semiconductor matrix material layer 10.

The two interdigitated comb structures (30, 40) may be arranged such that the two movable comb structures (301, 302) are proximal to each other and the two stationary comb structures (401, 402) are distal from each other. In other words, the lateral separation distance between the comb structure shaft portions of the two stationary comb structures (401, 402) along the second horizontal direction hd2 is greater than the lateral separation distance between the comb structure shaft portions of the two movable comb structures (301, 302).

A first portion of the semiconductor matrix material layer 10 having a generally elongated rectangular shape may be provided between the comb structure shaft portions of the two movable comb structures (301, 302), which corresponds to a region from which a proof mass (i.e., a center mass portion) may be subsequently patterned. Barrier structures 50 may be formed in the proof mass barrier trenches 51. A pair of barrier structures 50 may be laterally spaced apart along the first horizontal direction hd1. The comb structure shaft portions of the two movable comb structures (301, 302) may have extension portions that wraps around the barrier structures 52, and are subsequently used to form a structure that constricts lateral etching of the semiconductor matrix material layer 10 during a subsequent isotropic etch process.

Each comb structure teeth portion within the movable comb structures 30 and the stationary comb structures 40 includes a plurality of comb structure tooth portions that may be parallel to one another. Each comb structure tooth portion laterally extends away from a respective comb structure shaft portion along a common lengthwise direction of the comb structure tooth portions. Each comb structure tooth portion may be elongated along a lengthwise direction and may have a stem region having a substantially uniform width and attached to a respective comb structure shaft portion, and may have a pointed end segment having a width that gradually decreases with a distance from the respective comb structure shaft portion. The common lengthwise direction of the comb structure tooth portions within a comb structure teeth portion may be at an angle in a range from 1 degree to 10 degrees, such as from 2 degrees to 8 degrees. The pointed end segment of each comb structure tooth portion may be advantageously used to increase the change in capacitance during displacement of the movable structure to be subsequently formed.

The comb structure tooth portions of the first movable comb structure 301 and the comb structure tooth portions of the first stationary comb structure 401 may be interdigitated with parallel lengthwise directions for all comb structure tooth portions therein. The interdigitated region may include pointed end segments of the first movable comb structure 301 and the comb structure tooth portions of the first stationary comb structure 401. Likewise, comb structure tooth portions of the second movable comb structure 302 and the comb structure tooth portions of the second stationary comb structure 402 may be interdigitated with parallel lengthwise directions for all comb structure tooth portions therein. The interdigitated region may include pointed end segments of the second movable comb structure 302 and the comb structure tooth portions of the second stationary comb structure 402. The lengthwise directions of the comb structure tooth portions of the second movable comb structure 302 and the comb structure tooth portions of the second stationary comb structure 402 may be tilted in an opposite direction from the second horizontal direction hd2 with respective to the lengthwise direction of the comb structure tooth portions of the first movable comb structure 301 and the comb structure tooth portions of the first stationary comb structure 401. The overall pattern of the comb structures (30, 40) and the barrier structures 50 may have a mirror symmetry plane (MSP) that extends along the first horizontal direction hd1.

Figure 10A:
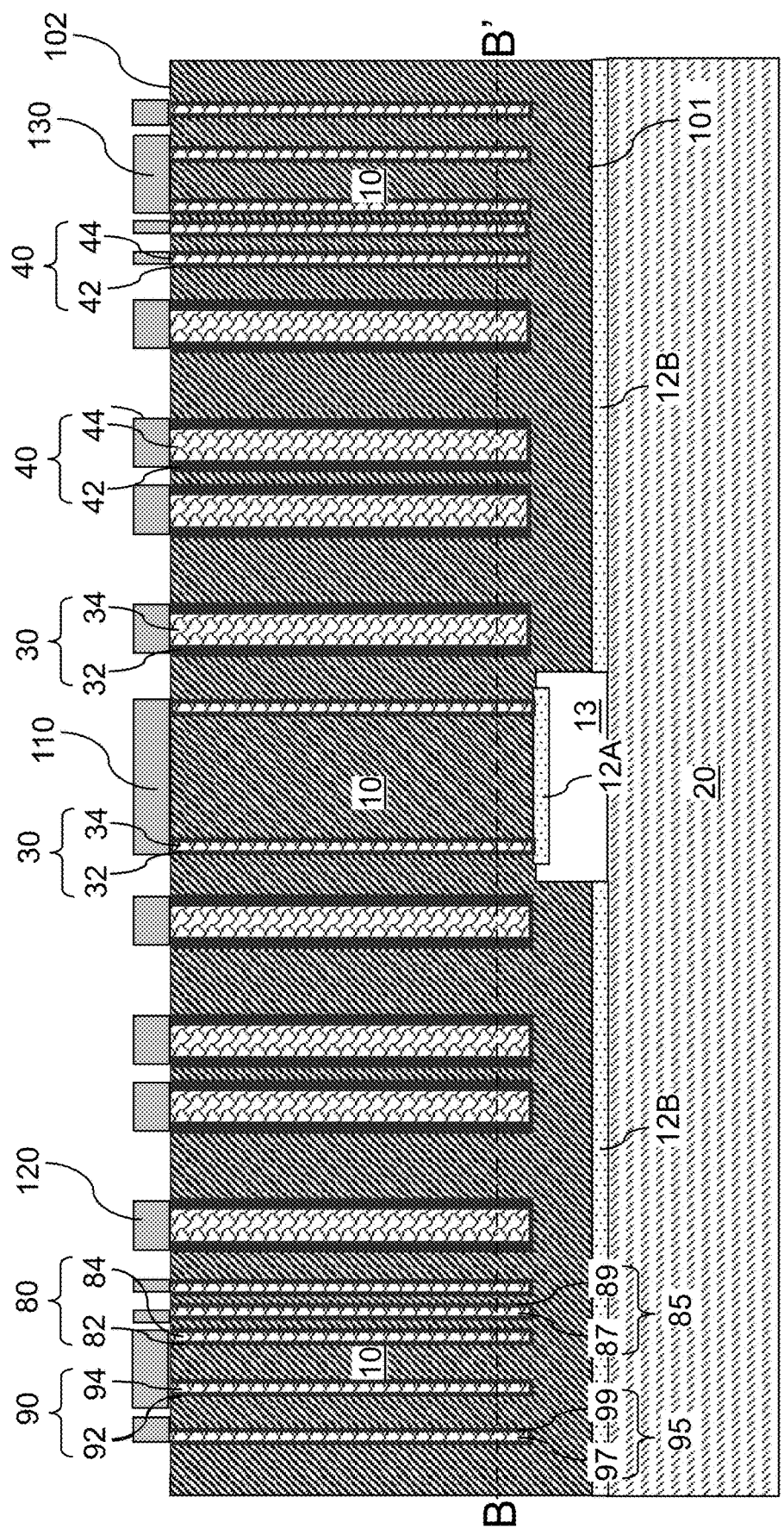
FIG. 10A is a vertical cross-sectional view of the exemplary structure after formation of metallic material portions according to an embodiment of the present disclosure.
Figure 10B:
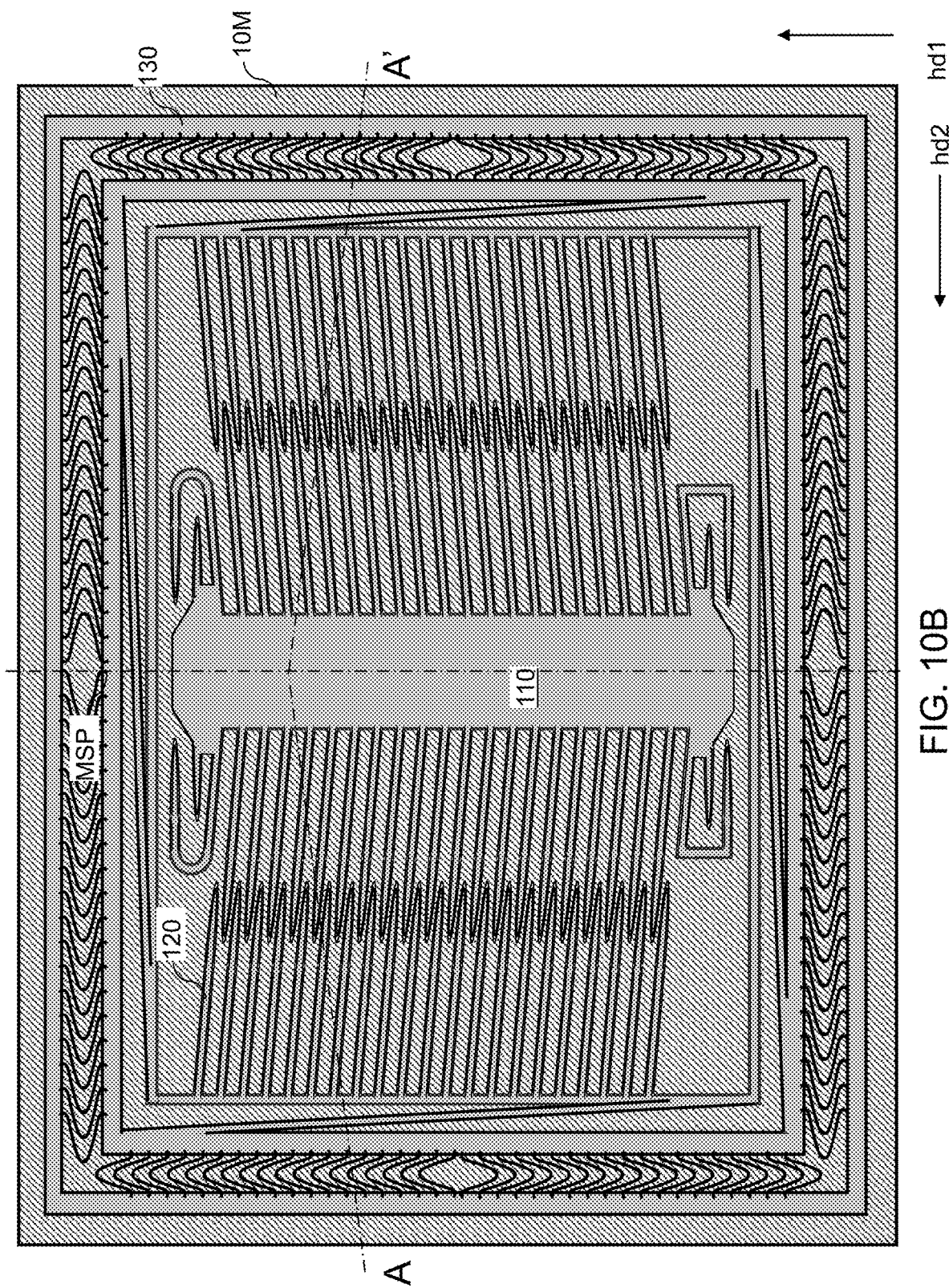
FIG. 10B is a top-down view of the exemplary structure along the plane B-B' of FIG. 10A. The hinged vertical plane A-A' is the plane of the vertical cross-sectional view of FIG. 10A.

Referring to FIGS. 10A and 10B, metallic material portions (110, 120, 130) may be formed on the second horizontal surface 102 of the semiconductor matrix material layer 10 and over the comb structures (30, 40). For example, a patterned deposition mask (not shown), such as a patterned photoresist layer, may be formed over the exemplary structure, and at least one metallic material may be deposited by physical vapor deposition. The at least one metallic material may include, for example, a metallic liner material (such as TiN, TaN, or WN) and an underbump metallurgy material such as Ni, Cr, Cu, and stacks thereof. The thickness of the at least one metallic material may be in a range from 100 nm to 2,000 nm, although lesser and greater thicknesses may also be used. The patterned deposition mask and portions of the at least one metallic material overlying the patterned deposition mask may be removed, for example, by a lift-off process.

Remaining portions of the at least one metallic material deposited on the movable comb structures 30 comprises a movable metallic plate 110. Remaining portions of the at least one metallic material deposited on the stationary comb structures 40 comprises stationary metallic plates 120. Remaining portions of the at least one metallic material deposited on the semiconductor matrix material layer 10 comprises a spring structure 130, which may include openings between an inner frame of the spring structure 130 and an outer frame of the spring structure 130. The spring structure 130 may have a suitable pattern to provide application of electrical bias voltages to opposing portions of the stationary comb structures 40.

Figure 11A:
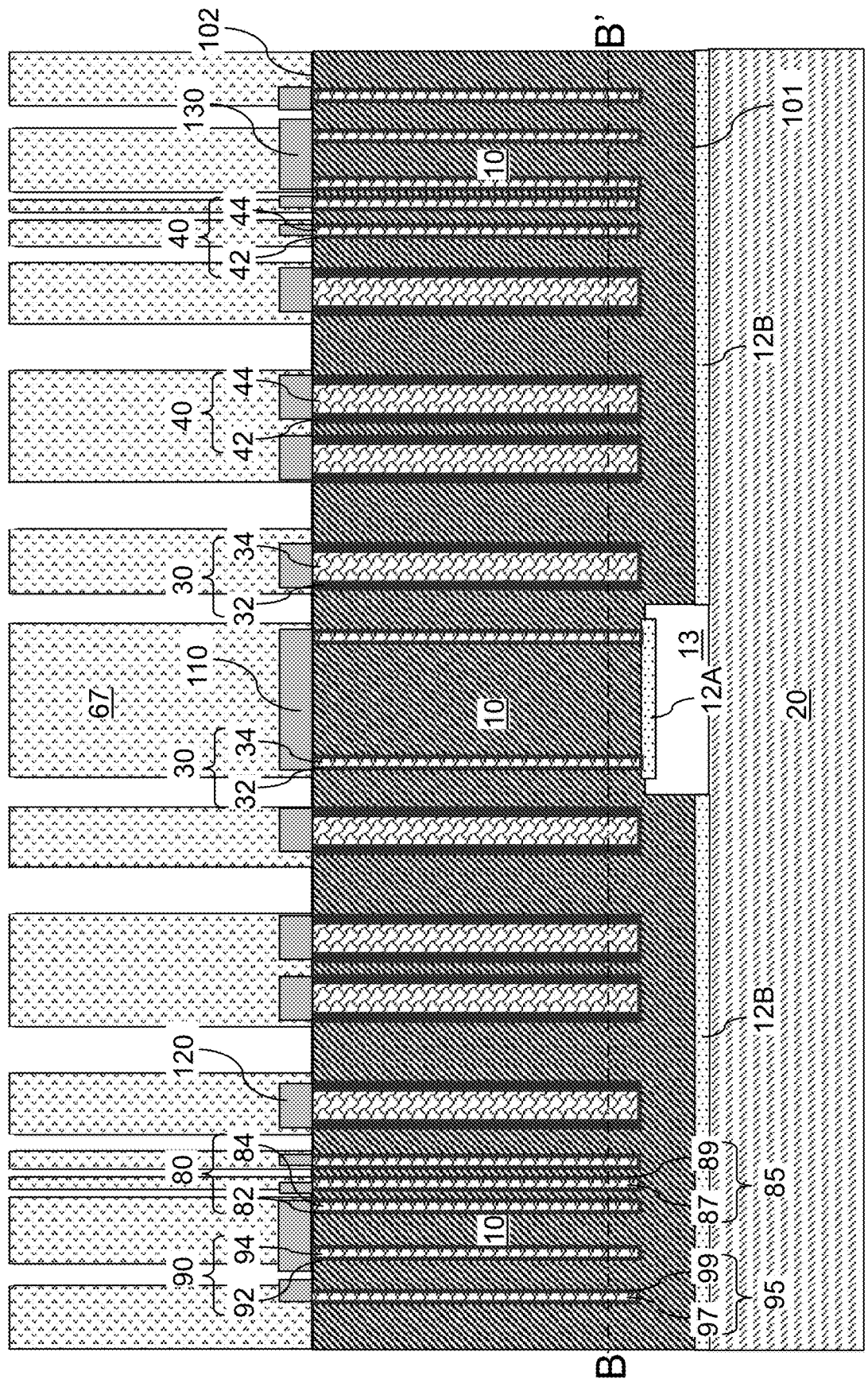
FIG. 11A is a vertical cross-sectional view of the exemplary structure after formation of a patterned etch mask layer according to an embodiment of the present disclosure.
Figure 11B:
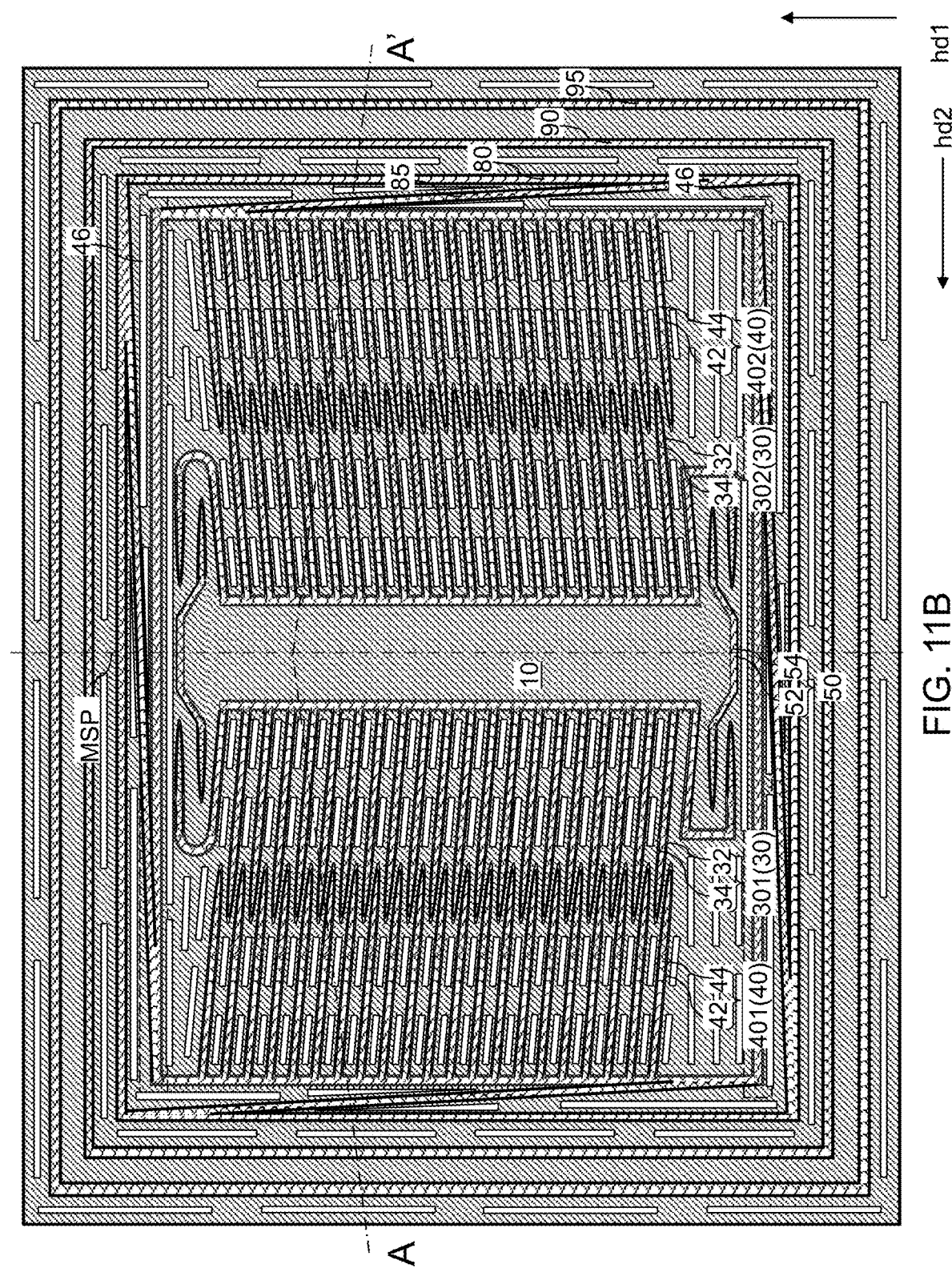
FIG. 11B is a partial see-through top-down view of the exemplary structure of FIG. 11A. The hinged vertical plane A-A' is the plane of the vertical cross-sectional view of FIG. 11A.
Figure 12A:
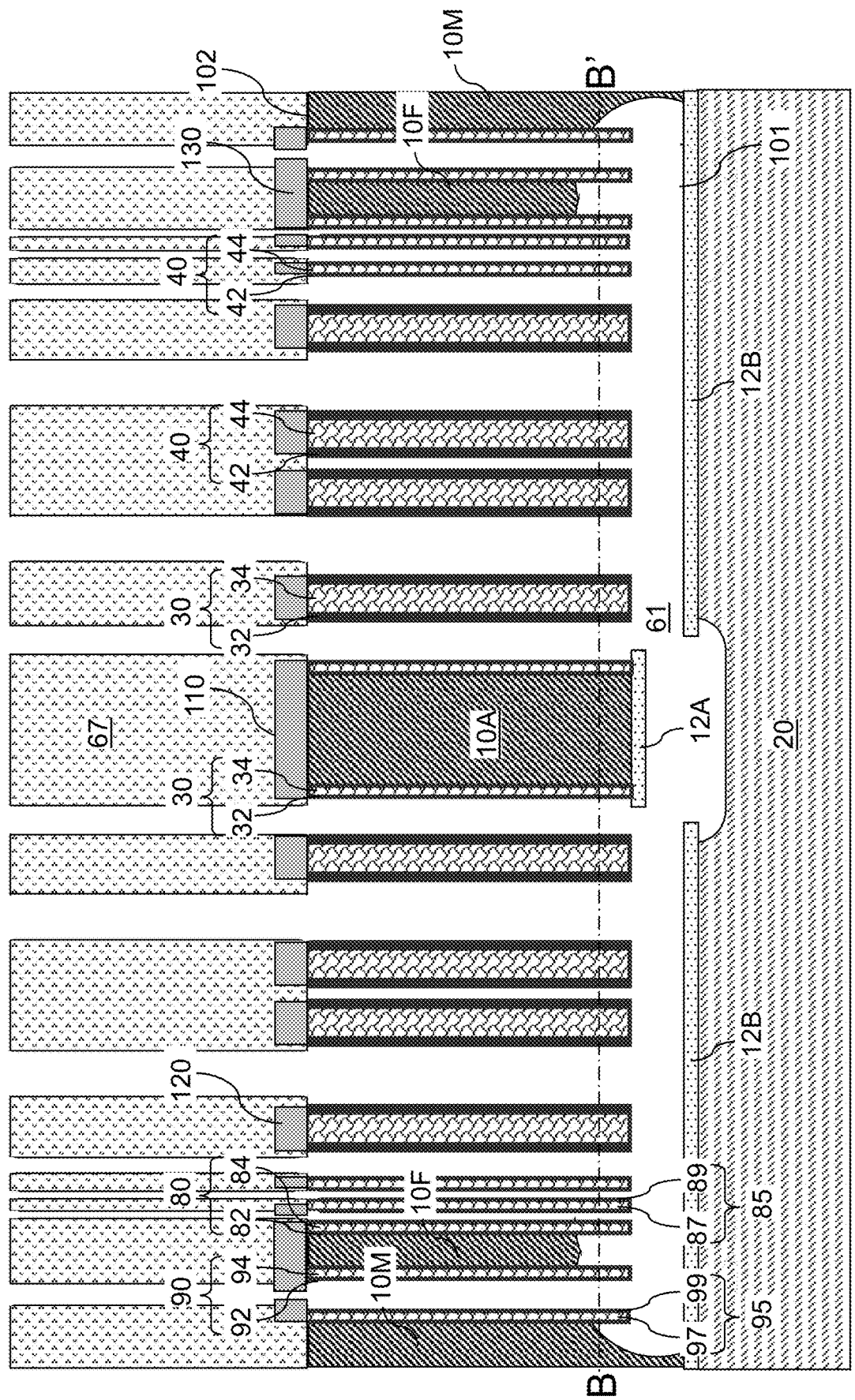
FIG. 12A is a vertical cross-sectional view of the exemplary structure after isotropically etching unmasked portions of the semiconductor matrix material layer selective to the patterned etch mask layer, the comb structures, the moat-trench fill structures, and the semiconductor oxide plates according to an embodiment of the present disclosure.
Figure 12B:
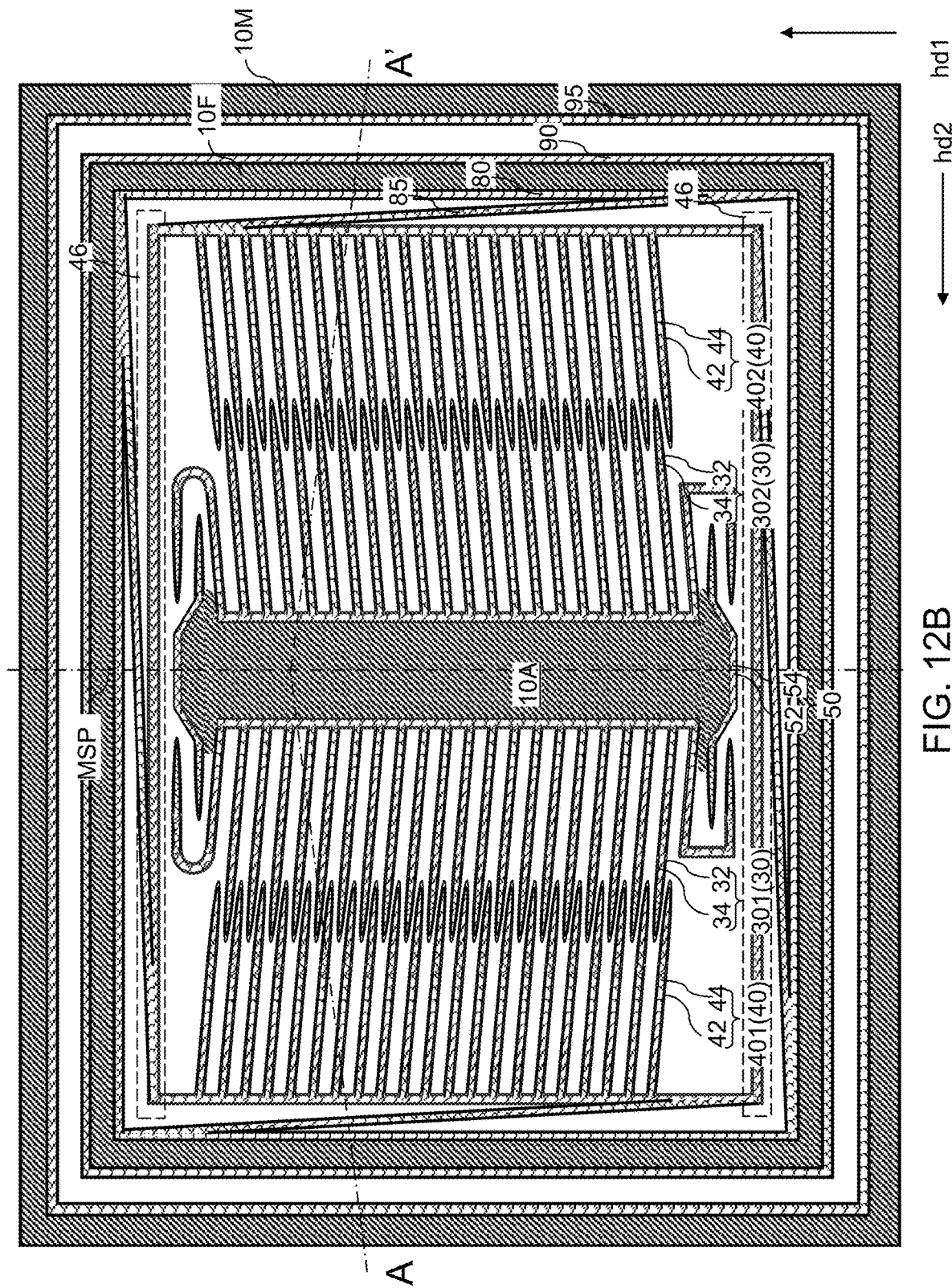
FIG. 12B is a horizontal cross-sectional view of the exemplary structure along the plane B-B' of FIG. 12A. The hinged vertical plane A-A' is the plane of the vertical cross-sectional view of FIG. 12A.

Referring to FIGS. 11A and 11B, an etch mask material layer 67 may be applied over various metallic material portions (110, 120, 130), and may be lithographically patterned to form openings therethrough. The etch mask material layer 67 may include a photoresist material, or may include a hard mask material such as silicon nitride, silicon oxide, or a dielectric metal oxide. The etch mask material layer 67 may be patterned either directly (if the etch mask material layer 67 includes a photoresist material), or may be patterned by applying and patterning a photoresist layer thereabove and by transferring the pattern in the photoresist layer into the etch mask material layer using an anisotropic etch process.

The pattern of the openings in the patterned etch mask layer 67 may be selected such that a subset of the openings in the patterned etch mask layer 67 is formed within a boundary defined by the comb shaft portion of the stationary comb structures 40 and the comb structure extension portions 46. Further, the pattern of the openings in the patterned etch mask layer 67 do not overlap with areas of the comb structures (30, 40), the comb structure extension portions 46, the barrier structures 50, or a portion of the semiconductor matrix material layer 10 located between the intermediate wall structure 90 and the distal wall structure 95. The openings in the patterned etch mask layer 67 are located within areas in which the metallic material portions (110, 120, 130) are not present. A subset of the openings in the patterned etch mask layer 67 may overlie the areas of gaps between neighboring pairs of comb structure tooth portions. A subset of the openings in the patterned etch mask layer 67 may be formed between the barrier structures 50 and the comb structure extension portions 46. Openings in the patterned etch mask layer 67 are not present within the first portion of the semiconductor matrix material layer 10 located between a pair of comb structure shaft portions of the movable comb structures 30 and lateral extensions thereof, and located between a pair of barrier structures 50. A subset of the openings in the patterned etch mask layer 67 may be formed between the proximal wall structure 80 and the comb structure extension portions 46.

Portions of the semiconductor matrix material layer 10 may be removed around the trenches (such as the first trench and the second trench) in which the comb structures (30, 40) are formed. In one embodiment, portions of the at least one trench fill material in the first trench comprise a movable comb structure 30, and portions of the at least one trench fill material in the second trench comprise a stationary comb structure 40. Generally, the movable comb structure 30 and the stationary comb structure 40 can be configured to generate an electrical output signal based on a change in capacitance between the movable comb structures 30 and the stationary comb structure 40 upon removal of the semiconductor matrix material layer 10.

Generally, areas of the first trench and the second trench can be masked with a patterned etch mask layer 67 after depositing the at least one trench fill material in the first trench and the second trench.

Portions of the semiconductor matrix material layer 10 that are not masked by the patterned etch mask layer 67 may be etched using a combination of an anisotropic etch process and an isotropic etch process, or using an isotropic etch process. In one embodiment, an anisotropic etch process may be formed to etch through the unmasked portions of the semiconductor matrix material layer 10. Deep trenches may be formed to the depth of the first semiconductor oxide plate 12A underneath the openings in the patterned etch mask layer 67.

Subsequently, an isotropic etch process using an isotropic etchant may be performed, which etches the semiconductor material of the semiconductor matrix material layer 10 selective to the dielectric materials of the first and second semiconductor oxide plates (12A, 12B) and the dielectric liners (33, 43, 52). A portion of the semiconductor matrix material layer 10 may be removed by the isotropic etch process. The removed portion of the semiconductor matrix material layer 10 include portions that are located within a lateral boundary defined by the comb structure shaft portions within the stationary comb structures 40, the comb structure extension portions 46, and the inner wall structure 80 and located outside the comb structure shaft portions of the movable comb structures 30. The removed portion of the semiconductor matrix material layer 10 is herein referred to as a second portion of the semiconductor matrix material layer 10. Further, the portion of the semiconductor matrix material layer 10 located between the intermediate wall structure 90 and the distal wall structure 95 is removed. The unetched portion of the semiconductor matrix material layer 10 that remains after the isotropic etch process and located outside the distal wall structure 95 is herein referred to as a semiconductor matrix layer 10M. The unetched portion of the semiconductor matrix material layer 10 that remains after the isotropic etch process and located between the proximal wall structure 80 and the intermediate wall structure 85 is herein referred to as a semiconductor frame 10F.

The isotropic etch process may use a wet etch process that etches the semiconductor material of the semiconductor matrix material layer 10 selective to the materials of the first and second semiconductor oxide plates (12A, 12B) and the dielectric liners (33, 43, 52). In one embodiment, the wet etch process may use hot trimethyl-2 hydroxyethyl ammonium hydroxide ("hot TMY") or tetramethyl ammonium hydroxide (TMAH). The duration of the isotropic etch process may be selected such that the etch front of the isotropic etch process reaches the entire area of the portion of the top surface of the second semiconductor oxide plate 12B located within the area defined by the combination of the comb structure shaft portions within the stationary comb structures 40, the comb structure extension portions 46, and the proximal wall structure 80. The comb structure extension portions 46 are attached to the semiconductor frame 10F through the spring wall structures 85 and the inner wall structure 80.

A movable structure including the movable comb structures 30, a first portion of the semiconductor matrix material layer 10 located between the movable comb structures 30 and remains unetched after the isotropic etch process, and a pair of barrier structures 50 that are attached to the first portion of the semiconductor matrix material layer 10 may be detached from a remaining unetched portion (which is herein referred to as a third portion) of the semiconductor matrix material layer 10 that remains outside the combination of the comb structure shaft portions within the stationary comb structures 40, the comb structure extension portions 46, and the proximal wall structure 80. In one embodiment, a peripheral region of the first portion of the semiconductor matrix material layer 10 may be collaterally etched by the isotropic etchant as the isotropic etchant flows through a meandering channel defined by the extensions of the comb structure shaft portions of the movable comb structures 30 and the barrier structures 50.

The first portion of the semiconductor matrix material layer 10 comprises a proof mass of a movable structure, which is herein referred to as a center mass portion 10A. The third portion of the semiconductor matrix material layer 10 is herein referred to as a semiconductor matrix layer 10M. The first and second semiconductor oxide plates (12A, 12B) and the dielectric liners (33, 43, 52) function as etch barrier structures that define the extent of a cavity 61 that is formed upon removal of the second portion of the semiconductor matrix material layer 10. Inner sidewalls of the comb structure shaft portions within the stationary comb structures 40, the comb structure extension portions 46, and the proximal wall structure 80 may function as an outer lateral boundary of the cavity 61. Sidewalls of the comb structure shaft portions of the movable comb structures 30 may function as an inner lateral boundary of the cavity 61, which encloses a first portion of the semiconductor matrix material layer 10 that is not etched by the isotropic etch process.

The volume of the recess cavity 13 may be incorporated into the cavity 61. In embodiments in which the cap substrate 20 includes a semiconductor material such as silicon, a surface of the cap substrate 20 that is not covered by the second semiconductor oxide plate 12B may be isotropically recessed to form a void, which is added to the cavity 61. The void may have an undercut underneath a periphery of the second semiconductor oxide plate 12B. The isotropic etchant may laterally etch the portion of the semiconductor matrix material layer 10 that underlies a boundary formed by the comb structure shaft portions within the stationary comb structures 40, the comb structure extension portions 46, and the proximal wall structure 80, and undercut portions of the semiconductor matrix material layer 10 located outside the boundary.

In an alternative embodiment, the anisotropic etch process may be omitted, and the isotropic etch process may be elongated to etch through the second portion of the semiconductor matrix material layer 10 to form the cavity. In such embodiments, the duration of the isotropic etch process may be prolonged to ensure that the etch front of the isotropic etch process reaches the entire area of the portion of the top surface of the second semiconductor oxide plate 12B located within the area defined by the combination of the comb structure shaft portions within the stationary comb structures 40, the comb structure extension portions 46, and the proximal wall structure 80.

Generally, the isotropic etchant of the isotropic etch process may be applied through the openings in the patterned etch mask layer 67. The isotropic etchant etches the semiconductor material of the semiconductor matrix material layer 10 selective to materials of the semiconductor oxide plates (12A, 12B) and selective to the material of the comb structures (30, 40) that contact the semiconductor matrix material layer 10, which may be the material of the dielectric liners (33, 43). The second portion of the semiconductor matrix material layer 10 that laterally surrounds the first portion of the semiconductor matrix material layer 10 may be removed selective to the comb structures (30, 40) using the isotropic etch process. The first portion of the semiconductor matrix material layer 10 may be protected from the etchant of the isotropic etch process by the first semiconductor oxide plate 12A, the pair of movable comb structures 30, and the patterned etch mask layer 67 located on the second horizontal surface 102 of the semiconductor matrix material layer 10 and covering the comb structures 30.

The portion of the patterned etch mask layer 67 covering the first portion of the semiconductor matrix material layer 10 protects the front side surface of the first portion of the semiconductor matrix material layer 10 during the isotropic etch process. The first semiconductor oxide plate 12A protects the backside of the first portion of the semiconductor matrix material layer 10 during the isotropic etch process. Thus, the center mass portion 10A, which is the first portion of the semiconductor matrix material layer 10 after the isotropic etch process, may have a uniform thickness between the first semiconductor oxide plate 12A and the interface with the patterned etch mask layer 67. In one embodiment, the center mass portion 10A may have a uniform thickness within an entire area that is laterally enclosed by the comb structure shaft portions of the movable comb structures 30 and the barrier structures 50.

The cavity 61 may be formed by the removal of the second portion of the semiconductor matrix material layer 10. The semiconductor matrix layer 10M, which includes the unetched third portion of the semiconductor matrix material layer 10, laterally surrounds the cavity 61. The movable structure (10A, 30, 50) including a combination of the first portion of the semiconductor matrix material layer 10 and the pair of movable comb structures 30 may be detached from the semiconductor matrix layer 10M by the isotropic etch process.

The movable comb structures 30 may be components of the movable structure (10A, 30, 50), and are hereafter referred to as movable comb structures 30. The movable comb structures 30 include a first movable comb structure 301 and a second movable comb structure 302. The comb structure teeth portions of the movable comb structures 30 comprise movable comb fingers of the movable structure (10A, 30, 50).

The stationary comb structures 40 may be stationary components, and as such, are hereafter referred to as stationary comb structures 40. The stationary comb structures 40 include a first stationary comb structure 401 and a second stationary comb structure 402. The comb structure teeth portions of the stationary comb structures 40 comprise stationary comb fingers. In one embodiment, the movable comb structure 30 comprises a comb shaft portion and movable comb fingers laterally protruding from the comb shaft portion, and the stationary comb structure 40 comprises stationary comb fingers that are interlaced with the movable comb fingers.

Figure 13A:
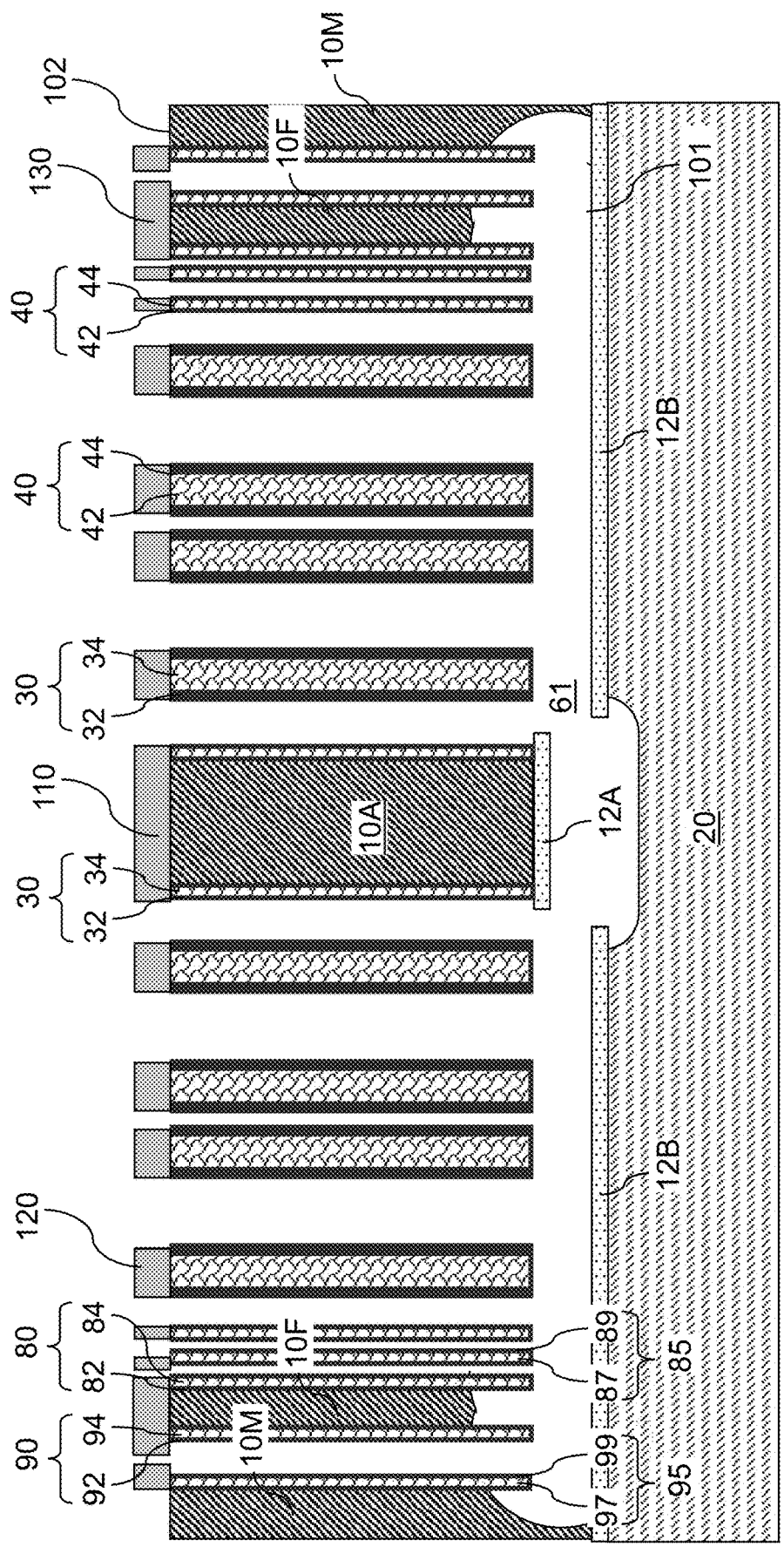
FIG. 13A is a vertical cross-sectional view of the exemplary structure after removal of the patterned etch mask layer according to an embodiment of the present disclosure.
Figure 13B:
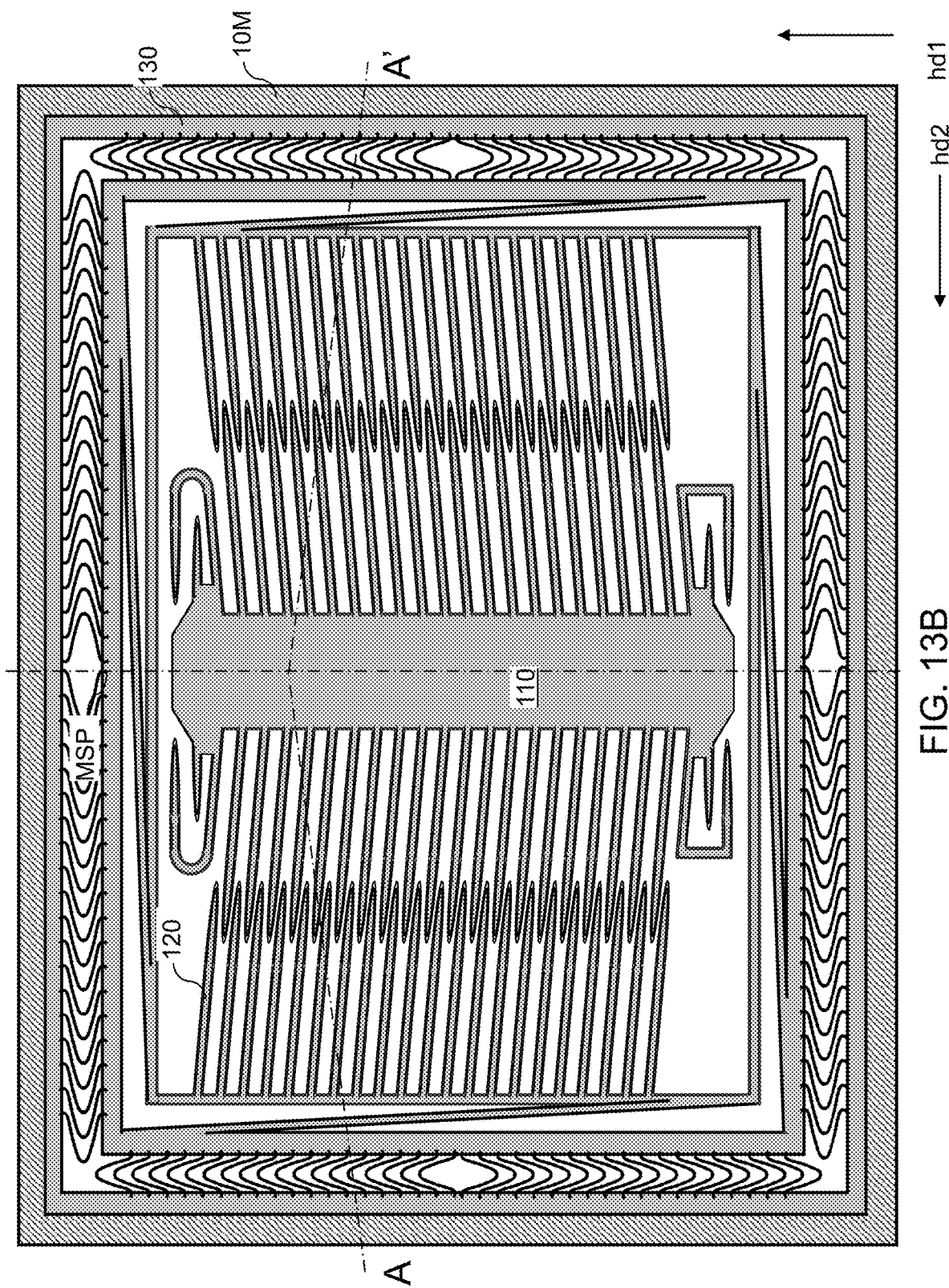
FIG. 13B is a top-down view of the exemplary structure along the plane B-B' of FIG. 13A. The hinged vertical plane A-A' is the plane of the vertical cross-sectional view of FIG. 13A.

Referring to FIGS. 13A and 13B, the patterned etch mask layer 67 may be removed, for example, by ashing. The metallic material portions (110, 120, 130) are located on the top surfaces of the movable structure (10A, 30, 50), the stationary comb structures 40, the semiconductor frame 10F, and the semiconductor matrix layer 10M. The metallic material portions (110, 120, 130) include a movable metallic plate 110 formed on the movable structure (10A, 30, 50), stationary metallic plates 120 formed on the stationary comb structures 40, and a spring structure 130 formed on the semiconductor frame 10F and the semiconductor matrix layer 10M and over the gap between the semiconductor frame 10F and the semiconductor matrix layer 10M. The spring structure 130 includes openings over the area of the gap in order to provide elasticity.

Figure 14:
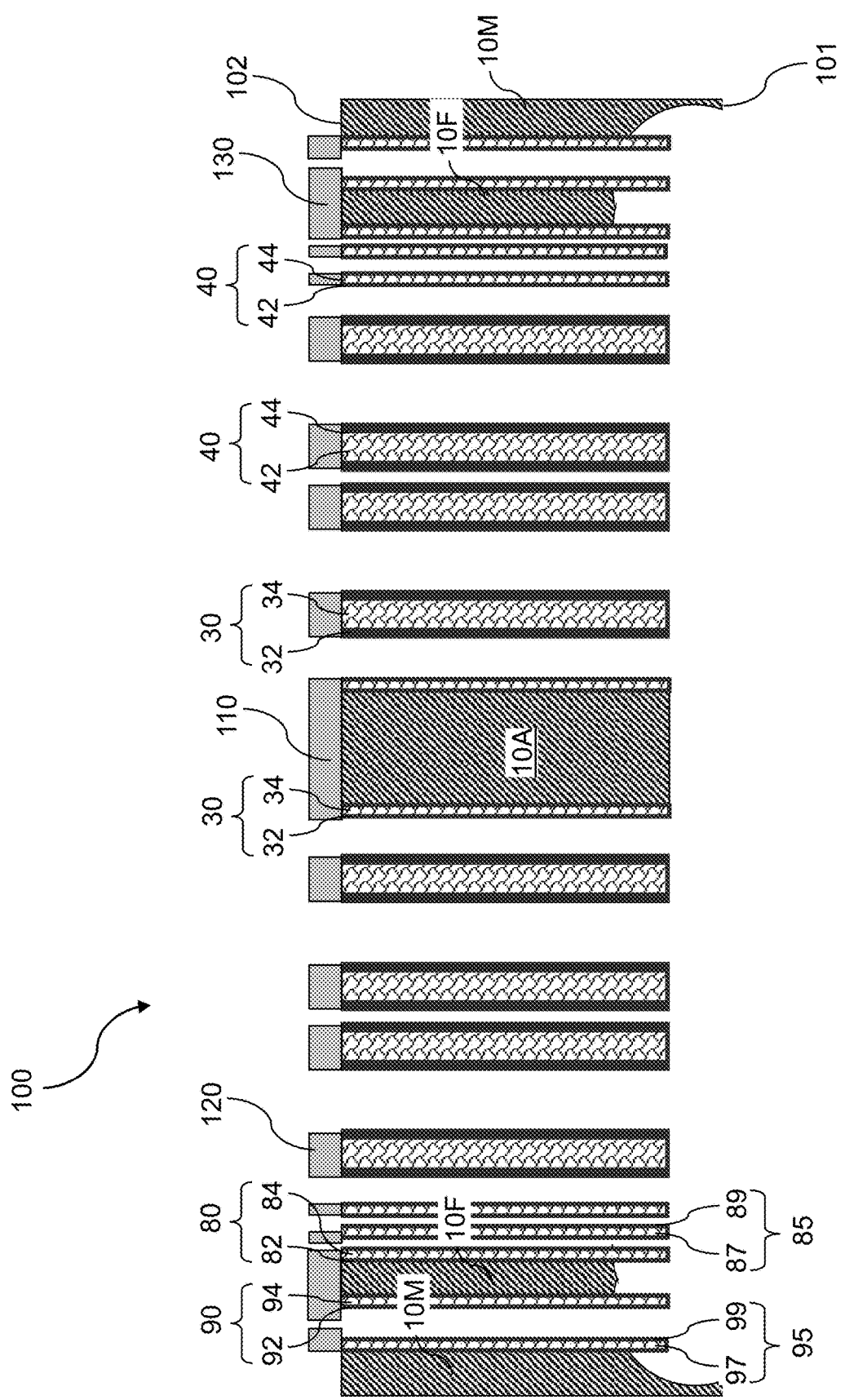
FIG. 14 is a vertical cross-sectional view of an accelerometer formed by detaching the cap substrate and singulating the exemplary structure into multiple accelerometers according to an embodiment of the present disclosure.

Referring to FIG. 14, each accelerometer 100 over the cap substrate 20 may be singulated, for example, by vacuum dicing. The cap substrate 20 may, or may not, be detached. In one embodiment, the cap substrate 20 may be detached, for example, by removing the semiconductor oxide plates (12A, 12B). For example, a wet etch using hydrofluoric acid may be performed to remove the semiconductor oxide plates (12A, 12B). Each accelerometer 100 can be electrically connected to a controller circuit or to a control unit using routing wires, which may be attached to the spring structures 130 or to the stationary metallic plates 120. The control circuit or the control unit may be configured to measure acceleration based on a change in the capacitance of the capacitor structure within the accelerometer 100.

While the present disclosure is described using an accelerometer 100 as an example, the methods of the present disclosure may be used to form any micro-electromechanical system (MEMS) device including a moving comb structure 30 and a stationary structure relative to which the moving comb structure 30 moves and generates an electrical signal.

Referring to FIGS. 1A-14 collectively and according to various embodiments of the present disclosure, a micro-electromechanical system (MEMS) device is provided, which comprises a movable comb structure 30 located in a cavity within an enclosure and comprising a comb shaft portion and movable comb fingers laterally protruding from the comb shaft portion, wherein the movable comb structure comprises a metallic material portion (32, 36); and a stationary structure (such as a stationary comb structure 40) affixed to the enclosure, wherein the movable comb structure 30 and the stationary structure are configured to generate an electrical output signal based on lateral movement of the movable comb structure 30 relative to the stationary structure.

In one embodiment, the movable comb structure 30 comprises a semiconductor material portion 34 in contact with the metallic material portion (32 or 36). In one embodiment, the semiconductor material portion 34 comprises a doped polycrystalline silicon-containing material having a doping of p-type or n-type.

In one embodiment, the movable comb structure 30 comprises a dielectric liner 33 in contact with the at least one metallic material portion 32. In one embodiment, surfaces of the dielectric liner 33 are physically exposed to the cavity. In one embodiment, the metallic material portion (32, 36) is laterally enclosed by the dielectric liner 33; and the dielectric liner 33 comprises a material selected from silicon oxide, silicon nitride, and a dielectric metal oxide.

In one embodiment, surfaces of the metallic material portion 32 are physically exposed to the cavity. In one embodiment, the metallic material portion (32, 36) comprises a material selected from an elemental metal, an intermetallic alloy, a metal-semiconductor alloy, and a conductive metallic nitride material. In one embodiment, the metallic material portion (32, 36) continuously extends through each of the movable comb fingers as a continuous structure. In one embodiment, the metallic material portion (32, 36) may include a region having a uniform width within each of the movable comb fingers.

In one embodiment, the stationary structure comprises a stationary comb structure including stationary comb fingers that are interlaced with the movable comb fingers. In one embodiment, the movable comb fingers comprise an additional metallic material portion (42, 46) having a same material composition as the metallic material portion (32, 36).

According to an aspect of the present disclosure, a micro-electromechanical system (MEMS) device is provided, which comprises: a movable comb structure 30 located in a cavity within an enclosure and including a comb shaft portion and movable comb fingers laterally protruding from the comb shaft portion, wherein the movable comb structure 30 comprises a first metallic material portion (32, 36); and a stationary structure (such as a stationary comb structure 40) affixed to the enclosure and comprising a second metallic material portion (42, 46) having a same material composition as the first metallic material portion (32, 36), wherein the movable comb structure 30 and the stationary structure are configured to generate an electrical output signal based on a change in capacitance between the movable comb structures and the stationary structure.

In one embodiment, the MEMS device comprises an accelerometer. In one embodiment, the movable comb structure comprises a first semiconductor material portion (34, 38); and the stationary structure comprises a second semiconductor material portion (44, 48) having a same material composition as the first semiconductor material portion (34, 38).

In one embodiment, the first metallic material portion (32, 36) continuously extends through each of the movable comb fingers; the stationary structure includes stationary comb fingers that are interlaced with the movable comb fingers; and the second metallic material portion (42, 46) continuously extends through each of the stationary comb fingers.

Figure 15:
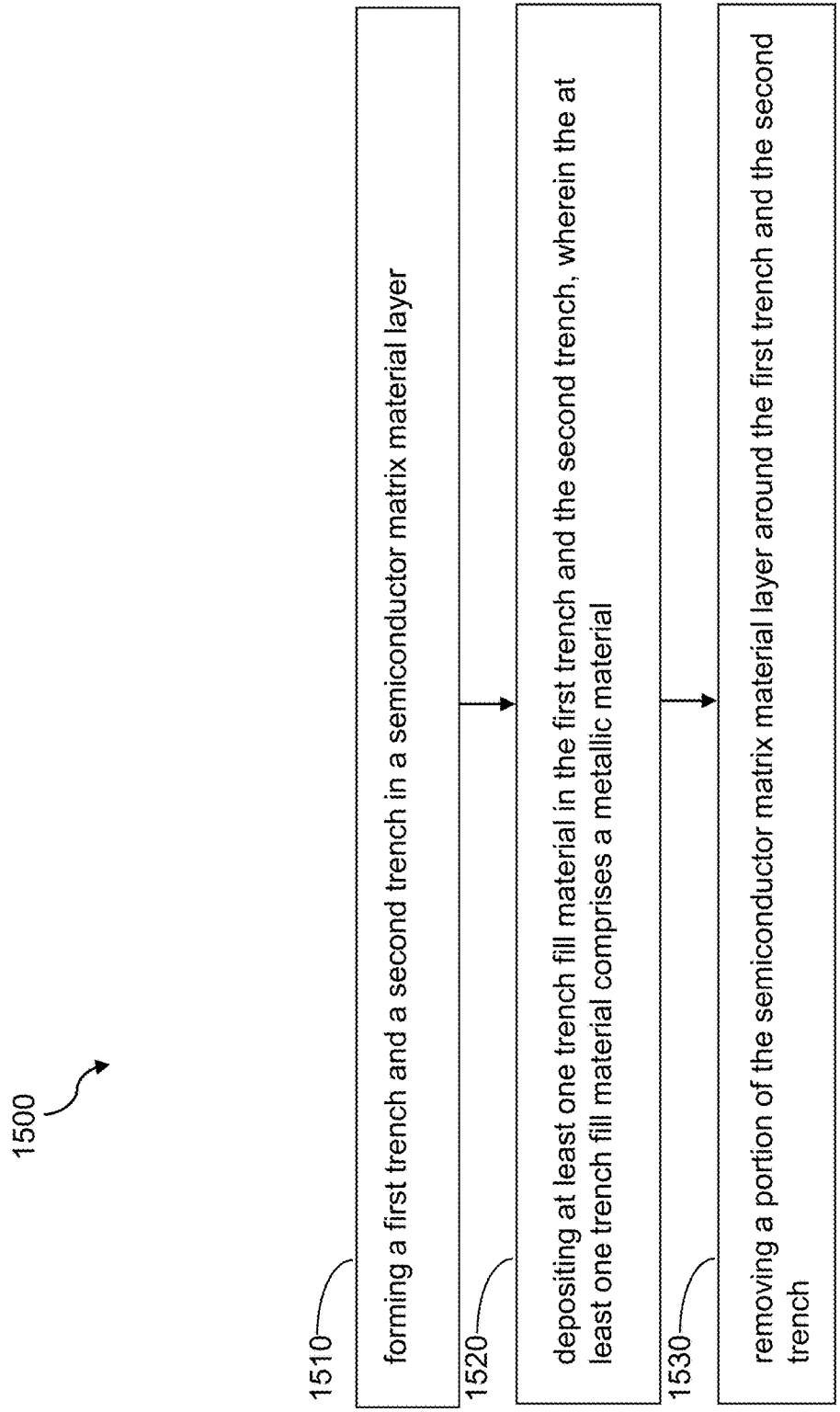
FIG. 15 is a flow chart illustrating a set of processing steps that may be performed to form a MEMS device according to embodiments of the present disclosure.

Referring to FIG. 15, a flow chart 1500 illustrates a set of processing steps that may be performed to form a MEMS device according to embodiments of the present disclosure. Referring to step 1510 and FIGS. 6A and 6B, a first trench (such as an inner comb trench 31) and a second trench (such as an outer comb trench 41) can be formed in a semiconductor matrix material layer 10. Referring to step 1520 and FIGS. 7A, 7B, 8A-8H, and 9A-9H, at least one trench fill material (33, 32, 34, 36, 38, 43, 42, 44, 46, 48) can be deposited in the first trench and the second trench. The at least one trench fill material comprises a metallic material that forms a metallic material portion (32, 36, 42, 46). Referring to step 1530 and FIGS. 10A-13B, a portion of the semiconductor matrix material layer 10 can be removed around the first trench and the second trench. Portions of the at least one trench fill material (33, 32, 34, 36, 38, 43, 42, 44, 46, 48) in the first trench comprise a movable comb structure 30, and portions of the at least one trench fill material (33, 32, 34, 36, 38, 43, 42, 44, 46, 48) in the second trench comprise a stationary structure (such as a stationary comb structure 40). The movable comb structure 30 and the stationary structure are configured to generate an electrical output signal based on a change in capacitance between the movable comb structures and the stationary structure, for example, as in an accelerometer.

The various embodiments of the present disclosure provide an MEMS device that uses a metallic material in at least one movable comb structure 30. The metallic material provides greater mechanical strength and resistance to breakage than a semiconductor material portion having the same geometry through increased malleability, and thus, can increase reliability of the MEMS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electromechanical system (MEMS) device, comprising:
a movable comb structure located in a cavity within an enclosure and comprising:
a comb shaft portion; and
movable comb fingers laterally protruding from the comb shaft portion, wherein the movable comb structure comprises a metallic material portion and a semiconductor material portion in direct contact with the metallic material portion; and
a stationary structure affixed to the enclosure, wherein the movable comb structure and the stationary structure are configured to generate an electrical output signal based on lateral movement of the movable comb structure relative to the stationary structure.

2. The MEMS device of claim 1, wherein the semiconductor material portion comprises a doped polycrystalline silicon-containing material having a doping of p-type or n-type.

3. The MEMS device of claim 1, wherein the movable comb structure comprises a dielectric liner in direct contact with an entirety of a bottom surface of the metallic material portion or in direct contact with an entirety of a bottom surface of the semiconductor material portion.

4. The MEMS device of claim 3, wherein surfaces of the dielectric liner are physically exposed to the cavity.

5. The MEMS device of claim 3, wherein:
the metallic material portion is laterally enclosed by the dielectric liner; and
the dielectric liner comprises a material selected from silicon oxide, silicon nitride, and a dielectric metal oxide.

6. The MEMS device of claim 1, wherein surfaces of the metallic material portion are physically exposed to the cavity.

7. The MEMS device of claim 1, wherein the metallic material portion comprises a material selected from an elemental metal, an intermetallic alloy, a metal-semiconductor alloy, and a conductive metallic nitride material.

8. The MEMS device of claim 1, wherein the metallic material portion continuously extends through each of the movable comb fingers as a continuous structure.

9. The MEMS device of claim 8, wherein the metallic material portion comprises a region having a uniform width within each of the movable comb fingers.

10. The MEMS device of claim 1, wherein the stationary structure comprises a stationary comb structure including stationary comb fingers that are interlaced with the movable comb fingers.

11. The MEMS device of claim 10, wherein the movable comb fingers comprise an additional metallic material portion having a same material composition as the metallic material portion.

12. The MEMS device of claim 1, wherein an entirety of a pair of sidewalls of the semiconductor material portion and an entirety of a bottom surface of the semiconductor material portion are in direct contact with the metallic material portion.

13. The MEMS device of claim 1, wherein an entirety of a pair of sidewalls of the metallic material portion and an entirety of a bottom surface of the metallic material portion are in direct contact with the semiconductor material portion.

14. A micro-electromechanical system (MEMS) device comprising:
a movable comb structure located in a cavity within an enclosure and comprising:

a comb shaft portion; and movable comb fingers laterally protruding from the comb shaft portion, wherein the movable comb structure comprises a first metallic material portion and a first semiconductor material portion in direct contact with the first metallic material portion; and a stationary structure affixed to the enclosure and comprising a second metallic material portion having a same material composition as the first metallic material portion, wherein the movable comb structure and the stationary structure are configured to generate an electrical output signal based on a change in capacitance between the movable comb structures and the stationary structure.

15. The MEMS device of claim 14, wherein:
the MEMS device comprises an accelerometer; and
the stationary structure comprises a second semiconductor material portion having a same material composition as the first semiconductor material portion.

16. The MEMS device of claim 14, wherein:
the first metallic material portion continuously extends through each of the movable comb fingers;
the stationary structure includes stationary comb fingers that are interlaced with the movable comb fingers; and
the second metallic material portion continuously extends through each of the stationary comb fingers.

17. A micro-electromechanical system (MEMS) device, comprising:
a movable comb structure located in a cavity within an enclosure and comprising:
a comb shaft portion; and
movable comb fingers laterally protruding from the comb shaft portion, wherein the movable comb structure comprises a combination of a first semiconductor material portion and a first metallic material portion; and a stationary structure affixed to the enclosure and comprising a combination of a second semiconductor material portion and a second metallic material portion, wherein the movable comb structure and the stationary structure are configured to generate an electrical output signal based on lateral movement of the movable comb structure relative to the stationary structure, wherein:
the first semiconductor material portion laterally surrounds the first metallic material portion; and
the second semiconductor material portion laterally surrounds the second metallic material portion.

18. The MEMS device of claim 17, wherein:
the movable comb structure further comprises a first dielectric liner that laterally surrounds the combination of the first semiconductor material portion and the first metallic material portion; and
the stationary structure further comprises a second dielectric liner that laterally surrounds the combination of the second semiconductor material portion and the second metallic material portion.

19. The MEMS device of claim 17, wherein:
the first metallic material portion laterally surrounds the first semiconductor material portion; and
the second metallic material portion laterally surrounds the second semiconductor material portion.

20. The MEMS device of claim 17, wherein:
the movable comb structure further comprises an additional first semiconductor material portion or an additional first metallic material portion; and
the stationary structure further comprises an additional second semiconductor material portion or an additional second metallic material portion.

* * * * *